(12) United States Patent
Ohsawa et al.

(10) Patent No.: US 8,164,088 B2
(45) Date of Patent: Apr. 24, 2012

(54) LIGHT EMITTING ELEMENT WITH LAYERS HAVING COMPLEMENTARY COLORS FOR ABSORBING LIGHT

(75) Inventors: Nobuharu Ohsawa, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 287 days.

(21) Appl. No.: 11/715,145

(22) Filed: Mar. 7, 2007

(65) Prior Publication Data

US 2007/0210322 A1    Sep. 13, 2007

(30) Foreign Application Priority Data

Mar. 8, 2006    (JP) .................................. 2006-061969

(51) Int. Cl.
*H01L 51/50*    (2006.01)
*H01L 33/36*    (2010.01)

(52) U.S. Cl. .................. 257/40; 257/103; 257/E51.021; 257/E51.042; 257/E51.05

(58) Field of Classification Search ........... 257/E51.019, 257/E51.021, E51.042, E51.043, E51.047, 257/E51.048, E51.049, E51.05, E51.051
See application file for complete search history.

(56) References Cited

U.S. PATENT DOCUMENTS

| | | | |
|---|---|---|---|
| 5,445,898 A | 8/1995 | Budzilek et al. | |
| 6,185,032 B1 | 2/2001 | Lee et al. | |
| 6,545,409 B2 | 4/2003 | Kahen | |
| 7,365,486 B2 | 4/2008 | Lee et al. | |
| 2002/0190638 A1 | 12/2002 | Kahen | |
| 2003/0127967 A1* | 7/2003 | Tsutsui et al. | 313/498 |
| 2005/0098207 A1 | 5/2005 | Matsumoto et al. | |
| 2005/0174046 A1 | 8/2005 | Hasegawa et al. | |
| 2006/0006796 A1 | 1/2006 | Lee et al. | |
| 2006/0040132 A1 | 2/2006 | Liao et al. | |
| 2006/0240278 A1* | 10/2006 | Hatwar et al. | 428/690 |
| 2007/0114527 A1* | 5/2007 | Kumaki et al. | 257/43 |
| 2007/0200125 A1* | 8/2007 | Ikeda et al. | 257/94 |

FOREIGN PATENT DOCUMENTS

| | | | |
|---|---|---|---|
| CN | 1674751 A | | 9/2005 |
| EP | 1 256 989 A2 | | 11/2002 |
| EP | 1 530 245 A2 | * | 5/2005 |
| EP | 1 865 566 A1 | * | 12/2007 |
| JP | 6-93258 | * | 4/1994 |
| JP | 8-222374 | | 8/1996 |
| JP | 9-232077 | * | 9/1997 |
| JP | 2002-252086 | * | 9/2002 |
| JP | 2005-166637 | * | 6/2005 |
| JP | 2005-201934 | | 7/2005 |
| WO | WO 00/35028 A1 | | 6/2000 |
| WO | WO 2005/064995 A1 | | 7/2005 |

OTHER PUBLICATIONS

Office Action re Chinese application No. CN 200710085863.3, dated Sep. 11, 2009 (with English translation).

(Continued)

*Primary Examiner* — Stephen W Smoot
(74) *Attorney, Agent, or Firm* — Husch Blackwell LLP

(57) ABSTRACT

A light emitting element with a high contrast is realized. A light emitting device with a high contrast is achieved by using the light emitting element with an excellent contrast. The light emitting element has a layer containing a light emitting substance interposed between a first electrode and a second electrode, and the layer containing the light emitting substance includes a light emitting layer, a layer containing a first organic compound, and a layer containing a second organic compound. The first electrode has a light-transmitting property, and the layer containing the first organic compound and the layer containing the second organic compound are interposed between the second electrode and the light emitting layer. Furthermore, color of the first organic compound and color of the second organic compound are complementary.

29 Claims, 14 Drawing Sheets

OTHER PUBLICATIONS

Office Action re Chinese application No. CN 200710085863.3, dated Jun. 22, 2011 (with English translation).

Lee, J.-H. et al, "High Contrast Ratio Organic Light-Emitting Devices Based on CuPC as Electron Transport Material," Synthetic Metals, vol. 144, No. 3, 2004, pp. 279-283.

Yen, C.-K. et al, "P-185: Black Electrode for Organic Light-Emitting Device," SID Digest '05: SID International Symposium Digest of Technical Papers, vol. 36, 2005, pp. 867-869.

European Search Report re application No. EP 07004805.3, dated Dec. 14, 2011.

* cited by examiner

LIGHT EMITTING ELEMENT WITH LAYERS HAVING COMPLEMENTARY COLORS FOR ABSORBING LIGHT

BACKGROUND OF THE INVENTION

1. Field of the Invention

The present invention relates to a current-excitation light emitting element. In addition, the present invention relates to a light emitting device and an electronic device each having the light emitting element.

2. Description of the Related Art

In recent years, a light emitting element using a light emitting organic compound has been actively researched and developed. A basic structure of this light emitting element is formed by interposing a layer containing a light emitting organic compound between a pair of electrodes. By application of a voltage to this element, electrons and holes are separately injected from the pair of electrodes into the layer containing a light emitting organic compound, and a current flows. Then, recombination of these carriers (the electrons and holes) causes the light emitting organic compound to be in an excited state and to emit light when the excited state returns to a ground state. Owing to such a mechanism, the light emitting element as described above is referred to as a current-excitation light emitting element.

It is to be noted that an excited state formed by an organic compound can be a singlet excited state or a triplet excited state. Light emission from the singlet excited state is referred to as fluorescence, and light emission from the triplet excited state is referred to as phosphorescence.

A great advantage of such a light emitting element is that the light emitting element can be manufactured to be thin and lightweight because the light emitting element is formed of an organic thin film with a thickness of, for example, approximately 0.1 μm. In addition, extremely high response speed is another advantage, because time between carrier injection and light emission is approximately 1 μsec or less. These characteristics are considered suitable for a flat panel display element.

Such a light emitting element is formed into a film shape. Thus, plane emission can be easily obtained by formation of a large-area element. This characteristic is hard to be obtained in a point light source typified by an incandescent lamp or an LED, or a line light source typified by a fluorescent lamp. Therefore, the above-described light emitting element also has a high utility value as a plane light source which is applicable to lighting or the like.

For the light emitting element as described above, in general, at least one of the pair of electrodes is formed using a light-transmitting material and the other is formed using various materials. Light emission from a light emitting substance passes through the electrode formed using a light-transmitting material and is extracted to external.

However, when a material with high reflectivity is used for the other electrode (the electrode which is not formed using a light-transmitting material), there has been a problem in that the electrode formed using the material with high reflectivity also reflects light from an external source, and thus, the contrast is decreased.

In order to solve the problem in that the contrast is decreased, a structure in which a polarizing element, a quarter-wave plate, or the like is provided outside of the light emitting element has been proposed.

However, the use of the polarizing element or the wave plate causes problems such as changes in chromatic characteristics due to wavelength dependence of the wave plate and view-angle dependence. Furthermore, provision of components such as the polarizing element and the wave plate increases the costs and complicates the manufacturing process, which has been a problem as well.

SUMMARY OF THE INVENTION

In view of the foregoing problem, it is an object of the present invention to provide a light emitting element which realizes a high contrast. More specifically, it is an object of the present invention to provide a light emitting element with a high contrast which can be manufactured easily. Furthermore, it is another object of the present invention to provide a light emitting device which realizes a high contrast by using the light emitting element excellent in contrast.

As a result of concerted study, the present inventors have found that the provision of a layer that absorbs visible light between a light emitting layer and a second electrode, in a light emitting element that has the light emitting layer interposed between a first electrode with a light-transmitting property and the second electrode, can achieve the objects. The present inventors have also found that the present invention is particularly effective when the reflectivity of the second electrode is high.

In other words, one feature of a light emitting element of the present invention is to include a layer containing a light emitting substance interposed between a first electrode and a second electrode, where the layer containing the light emitting substance includes a light emitting layer, a layer containing a first organic compound, and a layer containing a second organic compound; the first electrode has a light-transmitting property; the layer containing the first organic compound and the layer containing the second organic compound are interposed between the second electrode and the light emitting layer; and color of the first organic compound and color of the second organic compound are complementary.

Another feature of the light emitting element of the present invention is to include a layer containing a light emitting substance interposed between a first electrode and a second electrode, where the layer containing the light emitting substance includes a light emitting layer, a layer containing a first organic compound, and a layer containing a second organic compound; the first electrode has a light-transmitting property; the layer containing the first organic compound and the layer containing the second organic compound are interposed between the second electrode and the light emitting layer; and the first organic compound has the absorption peak in a wavelength region of greater than or equal to 380 nm and less than 540 nm, and the second organic compound has the absorption peak in a wavelength region of greater than or equal to 540 nm and less than or equal to 760 nm.

Another feature of the light emitting element of the present invention is to include a layer containing a light emitting substance interposed between a first electrode and a second electrode, where the layer containing the light emitting substance includes a light emitting layer, a layer containing a first organic compound, and a layer containing a second organic compound; the first electrode has a light-transmitting property; the layer containing the first organic compound and the layer containing the second organic compound are interposed between the second electrode and the light emitting layer; the first organic compound is any of 3,4,9,10-perylenetetracarboxylic acid derivatives, 1,4,5,8,-naphthalenetetracarboxylic acid derivatives, naphthacene derivatives, or nickel complexes; and the second organic compound is any of phthalocyanine derivatives, pentacene derivatives, 3,4,9,10-perylenetetracarboxylic-bis-benzimidazole derivatives, or violanthrone derivatives.

In the above structure, it is preferable that a third layer containing a conductive material be provided between the layer containing the first organic compound and the layer containing the second organic compound. As the conductive material, indium tin oxide, indium tin oxide containing silicon or silicon oxide, indium zinc oxide, indium tin oxide containing tungsten oxide and zinc oxide, or the like is given.

In addition, in the above structure, it is preferable that a third layer containing a semiconductor material be provided between the layer containing the first organic compound and the layer containing the second organic compound. As the semiconductor material, titanium oxide, vanadium oxide, niobium oxide, molybdenum oxide, tungsten oxide, rhenium oxide, ruthenium oxide, cobalt oxide, nickel oxide, zinc oxide, copper oxide, tin oxide, zinc sulfide, gallium nitride, gallium aluminum nitride, or the like is given.

Another feature of the light emitting element of the present invention is to include a layer containing a light emitting substance interposed between a first electrode and a second electrode, where the layer containing the light emitting substance includes a light emitting layer, an N-type semiconductor layer and a P-type semiconductor layer; the first electrode, the light emitting layer, the N-type semiconductor layer, the P-type semiconductor layer, and the second electrode are formed in this order; the first electrode has a light-transmitting property, and color of the N-type semiconductor layer and color of the P-type semiconductor layer are complementary.

Another feature of the light emitting element of the present invention is to include a layer containing a light emitting substance interposed between a first electrode and a second electrode, where the layer containing the light emitting substance includes a light emitting layer, an N-type semiconductor layer, and a P-type semiconductor layer; the first electrode, the light emitting layer, the N-type semiconductor layer, the P-type semiconductor layer, and the second electrode are formed in this order; the first electrode has a light-transmitting property; and the N-type semiconductor layer has the absorption peak in a wavelength region of greater than or equal to 380 nm and less than 540 nm, and the P-type semiconductor layer has the absorption peak in a wavelength region of greater than or equal to 540 nm and less than or equal to 760 nm.

Another feature of the light emitting element of the present invention is to include a layer containing a light emitting substance interposed between a first electrode and a second electrode, where the layer containing the light emitting substance includes a light emitting layer, an N-type semiconductor layer, and a P-type semiconductor layer; the first electrode, the light emitting layer, the N-type semiconductor layer, the P-type semiconductor layer, and the second electrode are formed in this order; the first electrode has a light-transmitting property; the N-type semiconductor layer contains any of 3,4,9,10-perylenetetracarboxylicdianhydride, 3,4,9,10-perylenetetracarboxylicdiimide, N,N'-dimethyl-3,4,9,10-perylenetetracarboxylicdiimide, 1,4,5,8-naphthalenetetracarboxylicdianhydride, or 1,4,5,8-naphthalenetetracarboxylicdiimide; and the P-type semiconductor layer contains any of phthalocyanine, copper phthalocyanine, zinc phthalocyanine, vanadyl phthalocyanine, titanyl phthalocyanine, nickel phthalocyanine, pentacene, or 6,13-diphenylpentacene.

Another feature of the light emitting element of the present invention is to include a layer containing a light emitting substance interposed between a first electrode and a second electrode, where the layer containing the light emitting substance includes a light emitting layer, an N-type semiconductor layer, and a P-type semiconductor layer; the first electrode, the light emitting layer, the N-type semiconductor layer, the P-type semiconductor layer, and the second electrode are formed in this order; the first electrode has a light-transmitting property; and the N-type semiconductor layer has the absorption peak in a wavelength region of greater than or equal to 540 nm and less than or equal to 760 nm, and the P-type semiconductor layer has the absorption peak in a wavelength region of greater than or equal to 380 nm and less than 540 nm.

Another feature of the light emitting element of the present invention is to include a layer containing a light emitting substance interposed between a first electrode and a second electrode, where the layer containing the light emitting substance includes a light emitting layer, an N-type semiconductor layer, and a P-type semiconductor layer; the first electrode, the light emitting layer, the N-type semiconductor layer, the P-type semiconductor layer, and the second electrode are formed in this order; the first electrode has a light-transmitting property; the N-type semiconductor layer contains any of (1,2,3,4,8,9,10,11,15,16,17,18,22,23,24,25-hexadecafluorophthalocyaninato)copper, (1,2,3,4,8,9,10,11,15,16,17,18,22,23,24,25-hexadecafluorophthalocyaninato)zinc, perfluoropentacene, or 3,4,9,10-perylenetetracarboxylic-bis-benzimidazole; and the P-type semiconductor layer contains any of naphthacene, 5,12-diphenylnaphthacene, or rubrene.

Another feature of the light emitting element of the present invention is to include a layer containing a light emitting substance interposed between a first electrode and a second electrode, where the layer containing the light emitting substance includes a light emitting layer, a P-type semiconductor layer, and an N-type semiconductor layer; the first electrode, the light emitting layer, the P-type semiconductor layer, the N-type semiconductor layer, and the second electrode are formed in this order; the first electrode has a light-transmitting property, and color of the P-type semiconductor layer and color of the N-type semiconductor layer are complementary.

Another feature of the light emitting element of the present invention is to include a layer containing a light emitting substance interposed between a first electrode and a second electrode, where the layer containing the light emitting substance includes a light emitting layer, a P-type semiconductor layer, and an N-type semiconductor layer; the first electrode, the light emitting layer, the P-type semiconductor layer, the N-type semiconductor layer, and the second electrode are formed in this order; the first electrode has a light-transmitting property; and the P-type semiconductor layer has the absorption peak in a wavelength region of greater than or equal to 380 nm and less than 540 nm, and the N-type semiconductor layer has the absorption peak in a wavelength region of greater than or equal to 540 nm and less than or equal to 760 nm.

Another feature of the light emitting element of the present invention is to include a layer containing a light emitting substance interposed between a first electrode and a second electrode, where the layer containing the light emitting substance includes a light emitting layer, a P-type semiconductor layer, and an N-type semiconductor layer; the first electrode, the light emitting layer, the P-type semiconductor layer, the N-type semiconductor layer, and the second electrode are formed in this order; the first electrode has a light-transmitting property; the P-type semiconductor layer contains any of naphthacene, 5,12-diphenylnaphthacene, or rubrene; and the N-type semiconductor layer contains any of (1,2,3,4,8,9,10,11,15,16,17,18,22,23,24,25-hexadecafluorophthalocyaninato)copper, (1,2,3,4,8,9,10,11,15,16,17,18,22,23,24,25-hexadecafluorophthalocyaninato)zinc, perfluoropentacene, or 3,4,9,10-perylenetetracarboxylic-bis-benzimidazole.

Another feature of the light emitting element of the present invention is to include a layer containing a light emitting substance interposed between a first electrode and a second electrode, where the layer containing the light emitting substance includes a light emitting layer, a P-type semiconductor layer, and an N-type semiconductor layer; the first electrode, the light emitting layer, the P-type semiconductor layer, the N-type semiconductor layer, and the second electrode are formed in this order; the first electrode has a light-transmitting property; and the P-type semiconductor layer has the absorption peak in a wavelength region of greater than or equal to 540 nm and less than or equal to 760 nm, and the N-type semiconductor layer has the absorption peak in a wavelength region of greater than or equal to 380 nm and less than 540 nm.

Another feature of the light emitting element of the present invention is to include a layer containing a light emitting substance interposed between a first electrode and a second electrode, where the layer containing the light emitting substance includes a light emitting layer, a P-type semiconductor layer, and an N-type semiconductor layer; the first electrode, the light emitting layer, the P-type semiconductor layer, the N-type semiconductor layer, and the second electrode are formed in this order; the first electrode has a light-transmitting property; the P-type semiconductor layer contains any of phthalocyanine, copper phthalocyanine, zinc phthalocyanine, vanadyl phthalocyanine, titanyl phthalocyanine, nickel phthalocyanine, pentacene, or 6,13-diphenylpentacene; and the N-type semiconductor layer contains any of 3,4,9,10-perylenetetracarboxylicdianhydride, 3,4,9,10-perylenetetracarboxylicdiimide, N,N'-dimethyl-3,4,9,10-perylenetetracarboxylicdiimide, 1,4,5,8-naphthalenetetracarboxylicdianhydride, or 1,4,5,8-naphthalenetetracarboxylicdiimide.

In the above structure, it is preferable that a third layer containing a conductive material be provided between the P-type semiconductor layer and the N-type semiconductor layer. As the conductive material, indium tin oxide, indium tin oxide containing silicon or silicon oxide, indium zinc oxide, indium tin oxide containing tungsten oxide and zinc oxide, or the like is given.

In addition, in the above structure, it is preferable that a third layer containing a semiconductor material be provided between the P-type semiconductor layer and the N-type semiconductor layer. As the semiconductor material, titanium oxide, vanadium oxide, niobium oxide, molybdenum oxide, tungsten oxide, rhenium oxide, ruthenium oxide, cobalt oxide, nickel oxide, zinc oxide, copper oxide, tin oxide, zinc sulfide, gallium nitride, gallium aluminum nitride, or the like is given.

Furthermore, in the above structure, it is preferable that the P-type semiconductor layer further contains an acceptor material. As the acceptor material, 7,7,8,8-tetracyano-2,3,5,6-tetrafluoroquinodimethane, chloranil, or the like is given. In addition, a transition metal oxide is given. For example, vanadium oxide, niobium oxide, tantalum oxide, chromium oxide, molybdenum oxide, tungsten oxide, manganese oxide, rhenium oxide, or the like can be used.

Furthermore, in the above structure, it is preferable that the N-type semiconductor layer further contains a donor material. As the donor material, an alkali metal, an alkaline earth metal, a rare earth metal, or a metal that belongs to Group 13 of the periodic table is given. For example, lithium (Li), cesium (Cs), magnesium (Mg), calcium (Ca), ytterbium (Yb), or indium (In) can be used.

Furthermore, the present invention includes a light emitting device having the above-described light emitting element in its category. The light emitting device in the present specification includes an image display device, a light emitting device, or a light source (including a lighting device). In addition, the light emitting device of the present invention includes all the following modules: a module in which a connector such as an FPC (flexible printed circuit), a TAB (tape automated bonding) tape or a TCP (tape carrier package) is attached to a panel provided with a light emitting element; a module provided with a printed wiring board at the end of the TAB tape or the TCP; and a module in which an IC (integrated circuit) is directly mounted to a light emitting element by a COG (chip on glass) method.

Furthermore, the present invention includes an electronic device using the light emitting element of the present invention for the display portion in its category. Accordingly, one feature of the electronic device of the present invention is to include a display portion provided with the above-described light emitting element and a controller for controlling light emission of the light emitting element.

A light emitting element of the present invention is provided with a layer that absorbs light emission between a light emitting region and an electrode, therefore, light reflected by the electrode can be reduced, and a high contrast can be realized.

Furthermore, a light emitting device of the present invention has a light emitting element that is excellent in contrast, therefore, a high contrast can be realized.

Furthermore, the light emitting element of the present invention can improve the contrast without using a polarizing plate, a quarter-wave plate, or the like outside of the element. For this reason, the contrast can be improved without an increase in the number of manufacturing steps. In addition, since the polarizing plate, the quarter-wave plate, or the like is not necessarily used, a light emitting element with a high contrast can be manufactured at low costs.

DETAILED DESCRIPTION OF THE INVENTION

Figure 1:
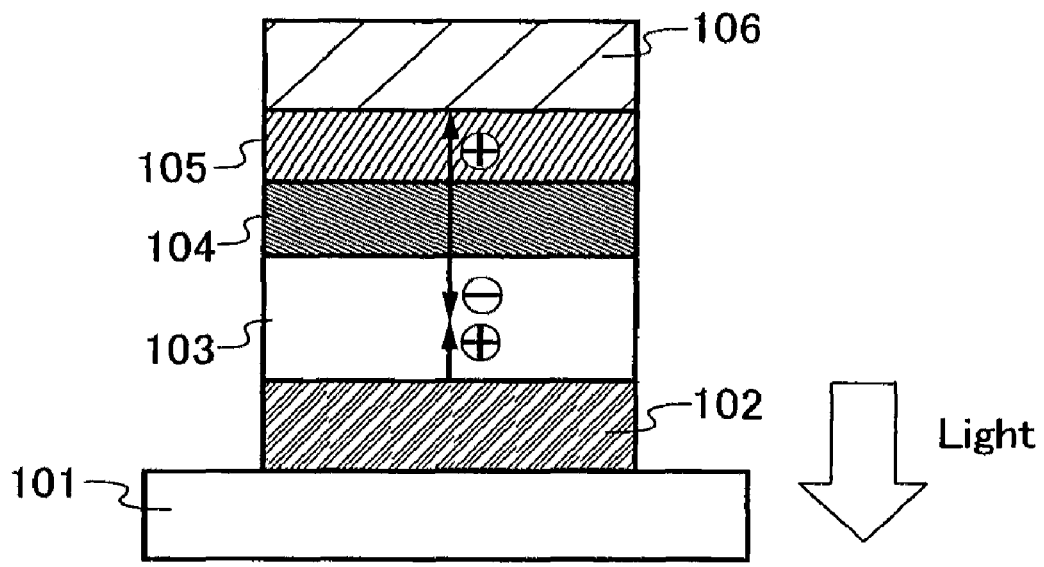
FIG. 1 is a view explaining a light emitting element of the present invention.

Embodiment Modes of the present invention will be described in detail below with reference to the drawings. However, the present invention is not limited to the description below and it is to be easily understood by those skilled in the art that the modes and details can be changed in various ways without departing from the spirit and scope of the present invention. Therefore, the present invention should not be interpreted as being limited to the description of Embodiment Modes below.

It is to be noted that, in the present specification, "composition" means not only a simple mixture of two materials but also a mixture of a plurality of materials in a condition where an electric charge is given and received among the materials.

Embodiment Mode 1

A light emitting element of the present invention has a layer containing a light emitting substance interposed between a first electrode and a second electrode. The layer containing the light emitting substance includes a light emitting layer, a first layer, and a second layer. The first electrode has a light-transmitting property, and the first layer and the second layer are interposed between the second electrode and the light emitting layer. In this embodiment mode, the first layer and the second layer that are included in the light emitting element of the present invention will be described.

The first layer and the second layer each contain an organic compound that has the absorption peak in a visible light region, and are layers that absorb visible light. The first layer contains a first organic compound, and the second layer contains a second organic compound. Color of the first organic compound and color of the second organic compound are complementary. For this reason, a stack of the first layer and the second layer can absorb visible light over a wide wavelength region. Specifically, the first organic compound has the absorption peak in a wavelength region of greater than or equal to 380 nm and less than 540 nm, and the second organic compound has the absorption peak in a wavelength region of greater than or equal to 540 nm and less than or equal to 760 nm.

As the first organic compound contained in the first layer, various materials can be used as long as the materials are organic compounds having the absorption peaks in a wavelength region of greater than or equal to 380 nm and less than 540 nm. In particular, an organic compound excellent in a carrier transporting property is preferably used. Specifically, 3,4,9,10-perylenetetracarboxylic acid derivatives, 1,4,5,8-naphthalenetetracarboxylic acid derivatives, a naphthacene derivatives, nickel complexes, or the like is given. For example, 3,4,9,10-perylenetetracarboxylicdianhydride (abbreviation: PTCDA), 3,4,9,10-perylenetetracarboxylicdiimide (abbreviation: PTCDI), N,N'-dimethyl-3,4,9,10-perylenetetracarboxylicdiimide (abbreviation: Me-PTCDI), 1,4,5,8-naphthalenetetracarboxylicdianhydride (abbreviation: NTCDA), 1,4,5,8-naphthalenetetracarboxylicdiimide (abbreviation: NTCDI), naphthacene, 5,12-diphenylnaphthacene, rubrene, N,N'-Disalicylideneethylenediaminatonickel (II) (abbreviation: [Ni (salen)]), NAN'-Disalicylidene-o-phenylenediaminatonickel (II) (abbreviation: [Ni (saloph)]), or the like is given. Structural formulas of these organic compounds are shown below.

[Chemical Formulas 1]

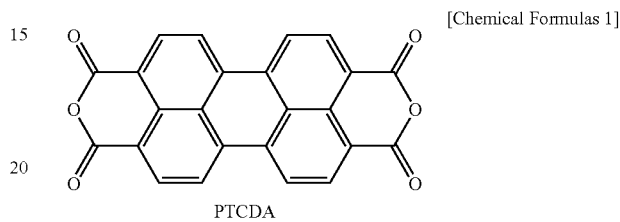

PTCDA

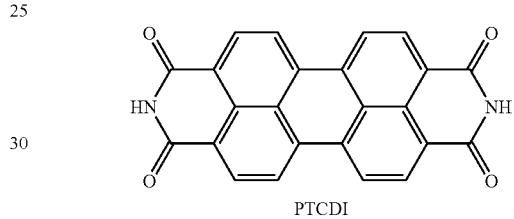

PTCDI

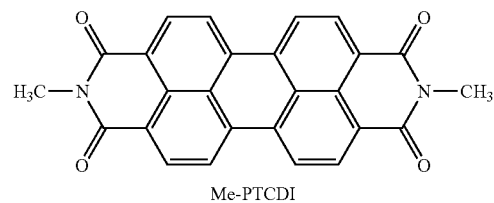

Me-PTCDI

Naphthacene

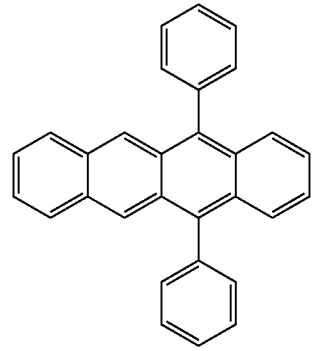

5,12-diphenylnaphthacene

-continued

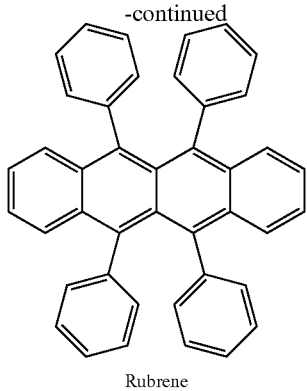

Rubrene

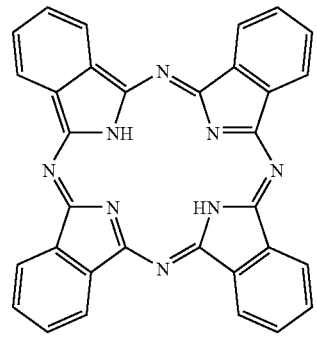

H₂Pc

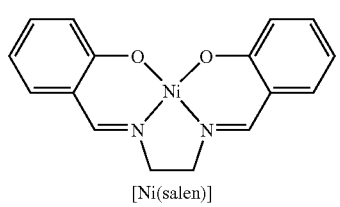

[Ni(salen)]

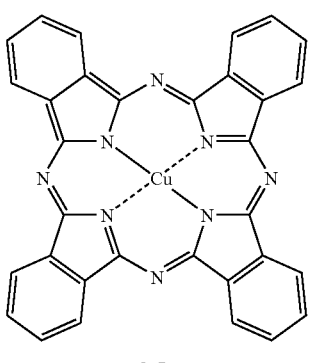

CuPc

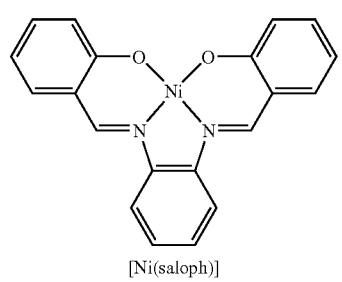

[Ni(saloph)]

As the second organic compound contained in the second layer, various materials can be used as long as the materials are organic compounds having the absorption peaks in a wavelength region of greater than or equal to 540 nm and less than or equal to 760 nm. In particular, an organic compound excellent in a carrier transporting property is preferably used. Specifically, phthalocyanine derivatives, pentacene derivatives, 3,4,9,10-perylenetetracarboxylic-bis-benzimidazole derivatives, violanthrone derivatives, or the like is given. For example, phthalocyanine (abbreviation: H₂Pc), copper phthalocyanine (abbreviation: CuPc), zinc phthalocyanine (abbreviation: ZnPc), vanadyl phthalocyanine (abbreviation: VOPc), titanyl phthalocyanine (abbreviation: TiOPc), nickel phthalocyanine (abbreviation: NiPc), (1,2,3,4,8,9,10,11,15, 16,17,18,22,23,24,25-hexadecafluorophthalocyaninato)copper (abbreviation: $F_{16}$—CuPc), (1,2,3,4,8,9,10,11,15,16,17, 18,22,23,24,25-hexadecafluorophthalocyaninato)zinc (abbreviation: $F_{16}$—ZnPc), pentacene, 6,13-diphenylpentacene, perfluoropentacene, 3,4,9,10-perylenetetracarboxylic-bis-benzimidazole (abbreviation: PTCBI, also referred to as bisbenzimidazo[2,1-a:2',1'-a]anthra[2,1,9-def:6,5,10-d'e'f'] diisoquinoline-10,21-dione), violanthrone, isoviolanthrone, or the like is given. Structural formulas of these organic compounds are shown below.

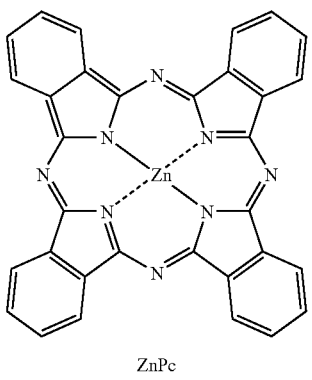

ZnPc

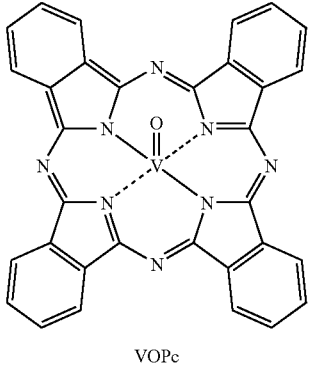

VOPc

-continued

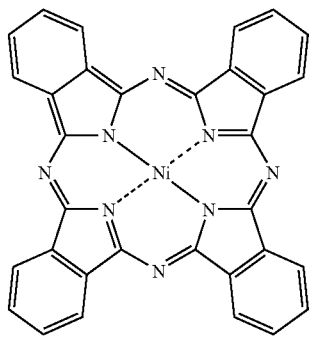

NiPc

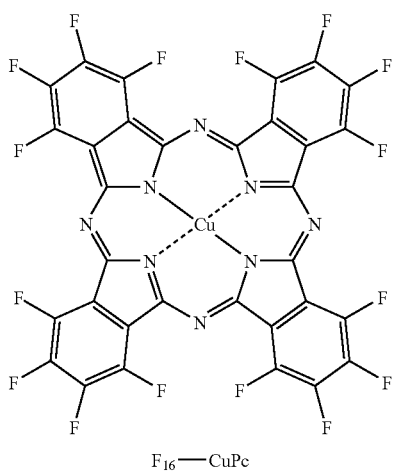

F₁₆—CuPc

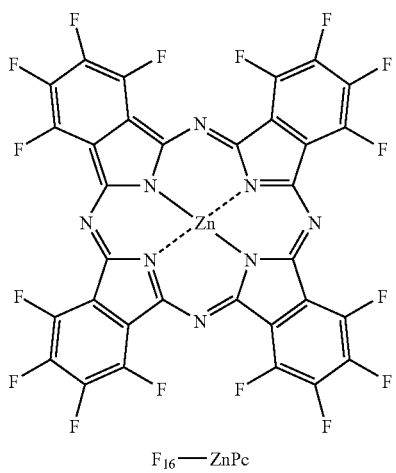

F₁₆—ZnPc

[Chemical Formulas 3]

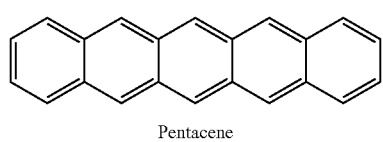

Pentacene

-continued

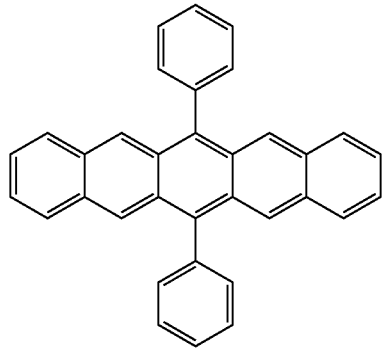

6,13-diphenylpentacene

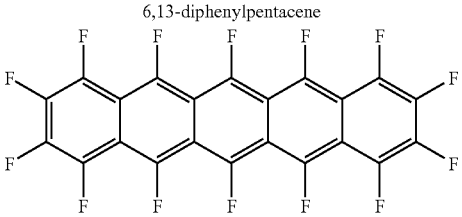

Perfluoropentacene

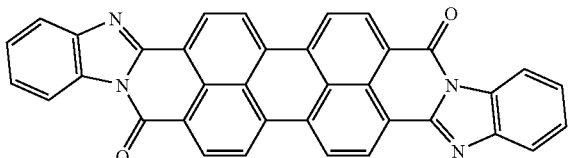

PTCBI

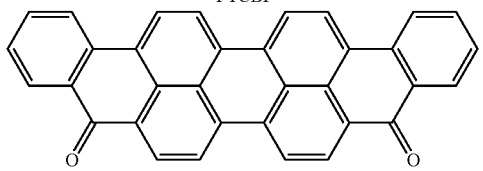

Violanthrone

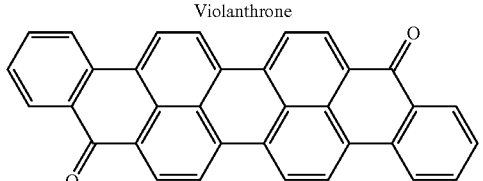

Isoviolanthrone

The first layer and the second layer are provided on a side of the light emitting layer that is opposite the side of the light emitting layer where the electrode with a light-transmitting property (the first electrode) is provided. In other words, the first layer and the second layer are provided on the side opposite to that of the electrode (the first electrode) through which light emission from the light emitting layer is extracted to external. Therefore, in the case where the second electrode has high reflectivity, the first layer and the second layer can absorb light emitted from the light emitting layer and light from an external source. In this way, light reflected by the second electrode can be reduced and the contrast of the light emitting element can be improved.

By making the first layer and/or the second layer thick, the absorbance in a visible light region can be increased. When the absorbance in the visible light region increases, light emitted from the light emitting layer can be absorbed better. In this way, the contrast of the light emitting element can be more improved.

Furthermore, a donor material or an acceptor material may be added to the first layer and/or the second layer. By adding a donor material or an acceptor material, the conductivity can be improved and the driving voltage of the light emitting element can be reduced. In the case where the first layer and/or the second layer are/is made thick, especially, an increase in driving voltage can be suppressed by addition of a donor material or an acceptor material. In this way, the contrast can be further improved while suppressing an increase in driving voltage.

As the donor material, an alkali metal, an alkaline earth metal, a rare earth metal, a metal that belongs to Group 13 of the periodic table, or an oxide or carbonate of these can be used. Specifically, lithium (Li), cesium (Cs), magnesium (Mg), calcium (Ca), ytterbium (Yb), indium (In), lithium oxide ($LiO_x$), cesium carbonate ($CsCO_3$), or the like can be used.

In addition, as the acceptor material, 7,7,8,8-tetracyano-2,3,5,6-tetrafluoroquinodimethane (abbreviation: $F_4$-TCNQ), chloranil, or the like can be given.

Furthermore, as the acceptor material, a transition metal oxide can be given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable, since it is stable in the air and its hygroscopic property is low so that it can be easily treated.

It is to be noted that the order of stacking the first layer and the second layer is not particularly limited. For example, the electrode that has a light-transmitting property (the first electrode), the light emitting layer, the first layer, the second layer, and the second electrode may be provided in this order. Alternatively, the electrode that has a light-transmitting property (the first electrode), the light emitting layer, the second layer, the first layer, and the second electrode may be provided in this order.

Furthermore, a layer containing a semiconductor material or conductive material may be provided between the first layer and the second layer. As the conductive material, for example, indium tin oxide (ITO), indium tin oxide containing silicon or silicon oxide, indium zinc oxide (IZO), indium oxide containing tungsten oxide and zinc oxide (IWZO), or the like is given. In addition, for example, a film of a metal such as aluminum (Al) or silver (Ag) that is formed to have a thickness of 1 to 50 nm, preferably approximately 5 to 20 nm, so as to have a light-transmitting property may be used. In addition, as the semiconductor material, titanium oxide ($TiO_x$), vanadium oxide ($VO_x$), niobium oxide ($NbO_x$), molybdenum oxide ($MoO_x$), tungsten oxide ($WO_x$), rhenium oxide ($ReO_x$), ruthenium oxide ($RuO_x$), cobalt oxide ($CoO_x$), nickel oxide ($NiO_x$), zinc oxide ($ZnO_x$), copper oxide ($CuO_x$), tin oxide ($SnO_x$), zinc sulfide (ZnS), gallium nitride (GaN), gallium aluminum nitride (AlGaN), or the like is given.

Any method, a wet method or a dry method, may be used to form the first layer and the second layer. For example, a vacuum evaporation method, an ink-jet method, a spin coat method, or the like may be used.

This embodiment mode can be appropriately combined with other embodiment modes.

Embodiment Mode 2

In this embodiment mode, one mode of a light emitting element with the layer that absorbs visible light described in Embodiment Mode 1 will be described with reference to FIG. 1.

A light emitting element of the present invention has a plurality of layers between a pair of electrodes. The plurality of layers are a combination of layers formed of a material with a high carrier-injecting property and a material with a high carrier-transporting property which are stacked so that a light emitting region is formed in a region away from the electrodes, that is, recombination of carriers is performed in an area away from the electrodes. Hereinafter, the layers formed between the electrodes will be referred to as layers containing a light emitting substance.

In this embodiment mode, a light emitting element includes a first electrode 102, a first layer 103, a second layer 104, and a third layer 105 which are stacked over the first electrode 102 in order, and a second electrode 106 provided thereover. It is to be noted that the description will be made below regarding the first electrode 102 as an anode and the second electrode 106 as a cathode.

The substrate 101 is used as a base of the light emitting element. As the substrate 101, glass, plastic, or the like may be used, for example. Other materials than those may be used, as long as the materials function as a base in the process of manufacturing the light emitting element.

It is preferable that the first electrode 102 be an electrode with a high light-transmitting property. In addition, a metal, an alloy, a conductive compound, or a mixture thereof, each of which has a high work function (specifically, 4.0 eV or more), or the like is preferably used. Specifically, for example, indium tin oxide (ITO), indium tin oxide containing silicon or silicon oxide, indium zinc oxide (IZO), indium oxide containing tungsten oxide and zinc oxide (IWZO), or the like is given. Such conductive metal oxide films are usually formed by sputtering, but may also be formed by using a sol-gel method or the like. For example, indium zinc oxide (IZO) can be formed by a sputtering method using a target in which zinc oxide of 1 to 20 wt % is added to indium oxide. Indium oxide containing tungsten oxide and zinc oxide (IWZO) can be formed by a sputtering method using a target containing tungsten oxide of 0.5 to 5 wt % and zinc oxide of 0.1 to 1 wt % with respect to indium oxide. Other than these, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride: TiN) or the like may be used to form a film having a thickness of 1 to 50 nm, preferably approximately 5 to 20 nm, so as to serve as the first electrode 102.

The first layer 103 is a layer that contains a light emitting substance. The first layer 103 may be structured as a single layer, or a plurality of layers may be stacked to form the first layer 103. The layered structure is not particularly limited, and layers each formed of a material with a high electron-transporting property, a material with a high hole-transporting property, a material with a high electron-injecting property, a material with a high hole-injecting property, a bipolar material (a material with high electron-transporting and hole-transporting properties) and the like may be appropriately combined. For example, a hole-injecting layer, a hole-transporting layer, a hole-blocking layer, a light emitting layer, an electron-transporting layer, an electron-injecting layer, and the like may be appropriately combined to constitute the first layer 103. Specific materials to form each of the layers will be given below.

A hole-injecting layer is a layer that contains a material with a high hole-injecting property. As the material with a high hole-injecting property, molybdenum oxide ($MoO_x$), vanadium oxide ($VO_x$), ruthenium oxide ($RuO_x$), tungsten oxide ($WO_x$), manganese oxide ($MnO_x$), or the like may be used. In addition, it is possible to use a phthalocyanine-based compound such as phthalocyanine ($H_2Pc$) or copper phthalocyanine (CuPc), a high molecule such as Poly(3,4-ethylenedioxythiophene)/poly(styrenesufonate) (PEDOT/PSS), or the like to form the hole-injecting layer.

Alternatively, as the hole-injecting layer, a composite material of a material with a high hole-transporting property containing an acceptor material may be used. It is to be noted that, by using the material with a high hole-transporting property containing an acceptor material, a material used to form an electrode may be selected regardless of its work function. In other words, besides a material with a high work function, a material with a low work function may also be used as the first electrode 102. As the acceptor material, 7,7,8,8-tetracyano-2,3,5,6-tetrafluoroquinodimethane (abbreviation: $F_4$-TCNQ), chloranil, or the like can be given. In addition, a transition metal oxide is given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable since it is stable in the air and its hygroscopic property is low so that it can be easily treated.

As the organic compound for the composite material, various compounds such as an aromatic amine compound, carbazole derivatives, aromatic hydrocarbon, and a high-molecular compound (such as oligomer, dendrimer, or polymer) can be used. The organic compound used for the composite material is preferably an organic compound having a high hole-transporting property. Specifically, a material having a hole mobility of $10^{-6}$ cm$^2$/Vs or higher is preferably used. However, other materials than those may also be used as long as the materials have higher hole-transporting properties than electron-transporting properties. The organic compounds which can be used for the composite material will be specifically shown below.

For example, the followings can be given as the aromatic amine compound: N,N'-bis(4-methylphenyl)(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N'-(3-methylphenyl)-N'-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); and the like.

As the carbazole derivatives which can be used for the composite material, the followings can be given specifically: 3-[N-(9-phenylcarbazole-3-yl)-N-phenylamino]-9-phenylcarbazole (abbreviation: PCzPCA1); 3,6-bis[N-(9-phenylcarbazole-3-yl)-N-phenylamino]-9-phenylcarbazole (abbreviation: PCzPCA2); 3-[N-(1-naphtyl)-N-(9-phenylcarbazole-3-yl)amino]-9-phenylcarbazole (abbreviation: PCzPCN1); and the like.

Moreover, 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); 1,4-bis[4-(N-carbazolyl)phenyl]-2,3,5,6-tetraphenylbenzene; or the like can also be used.

As the aromatic hydrocarbon which can be used for the composite material, the followings can be given for example: 2-tert-butyl-9,10-di(2-naphthyl)anthracene (abbreviation: t-BuDNA); 2-tert-butyl-9,10-di(1-naphthyl)anthracene, 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 9,10-bis[2-(1-naphthyl)phenyl]-2-tert-butyl-anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides those, pentacene, coronene, or the like can also be used. In particular, the aromatic hydrocarbon which has a hole mobility of $1\times10^{-6}$ cm$^2$/Vs or higher and which has 14 to 42 carbon atoms is particularly preferable.

The aromatic hydrocarbon which can be used for the composite material may have a vinyl skeleton. As the aromatic hydrocarbon having a vinyl group, the followings are given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Moreover, a high molecular compound such as poly(N-vinylcarbazole) (abbreviation: PVK) or poly(4-vinyltriphenylamine) (abbreviation: PVTPA) can also be used.

The hole-transporting layer is a layer that contains a material with a high hole-transporting property. As the material with a high hole-transporting property, for example, an aromatic amine compound such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), or 4,4'-bis[N-(spiro-9,9'-bifluoren-2-yl)-N-phenylamino]biphenyl (abbreviation: BSPB) can be used. These materials mainly are materials each having a hole mobility of $10^{-6}$ cm$^2$/Vs or higher. However, other materials than these may also be used as long as the hole-transporting properties thereof are higher than the electron-transporting properties. The layer containing a material with a high hole-transporting property is not limited to a single layer, and two or more layers containing the aforementioned materials may be stacked.

The light emitting layer is a layer that contains a material with a high light emitting property, and can be made of various kinds of materials. For example, a material with a high light emitting property is freely combined with a material with a high carrier-transporting property and good film quality (that is, a material difficult to be crystallized), such as tris(8-quinolinolato)aluminum (abbreviation: Alq), 2-tert-butyl-9,10-di(2-naphthyl)anthracene (abbreviation: t-BuDNA), or 4,4'-bis[N-(1-naphthyl)-N-phenylamino]biphenyl (abbreviation: NPB). Specifically, the material with a high light emitting property may be a singlet light emitting material (fluorescent material) such as N,N'-dimethylquinacridone (abbreviation: DMQd), N,N'-diphenylquinacridone (abbreviation: DPQd), coumarin 6, 4-(dicyanomethylene)-2-methyl-6-(p-dimethylaminostyryl)-4H-pyran (abbreviation: DCM1), 4-(dicyanomethylene)-2-methyl-6-[2-(julolidine-9-yl)vinyl]-4H-pyran (abbreviation: DCM2), 9,10-diphenylanthracene, 5,12-diphenyltetracene (abbreviation: DPT), perylene, or rubrene, or a triplet light emitting material (phosphorescent material) such as bis[2-(2'-benzo[4,5-a]thienyl) pyridinato-N,$C^3$']iridium(acetylacetonate) (abbreviation: Ir(btp)$_2$(acac)). However, since Alq and DNA are materials with high light emitting properties, the third layer 105 may be formed of only one of these materials.

The electron-transporting layer is a layer that contains a material with a high electron-transporting property. For example, a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq3), bis(10-hydroxybenzo[h]-quinolinato)beryllium (abbreviation: BeBq$_2$), or bis(2-methyl-8-quinolinolato)(4-phenylphenolato)aluminum (abbreviation: BAlq) can be used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$) can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The materials mentioned here mainly are materials each having an electron mobility of $10^{-6}$ cm$^2$/Vs or higher. The electron-transporting layer may be formed of other materials than those described above as long as the materials have higher electron-transporting properties than hole-transporting properties. Furthermore, the electron-transporting layer is not limited to a single layer, and two or more layers made of the aforementioned materials may be stacked.

In addition, an electron-injecting layer may be provided. As the electron-injecting layer, an alkali metal, an alkaline earth metal, or a compound thereof such as lithium fluoride (LiF), cesium fluoride (CsF), or calcium fluoride (CaF$_2$) may be used. For example, a layer of a material having an electron-transporting property containing an alkali metal, an alkaline earth metal, or a compound thereof, such as Alq which contains magnesium (Mg), may be used. By using a layer of a material having an electron-transporting property containing an alkali metal or an alkaline earth metal, electron injection from an N-type semiconductor layer as the second layer 104 is performed efficiently, which is preferable.

The second layer 104 is an N-type semiconductor layer. As the second layer 104, the organic compound described in Embodiment Mode 1 which has the absorption peak in a visible light region may be used to form a layer functioning as an N-type semiconductor. The second layer 104 is not limited to a single layer, and a plurality of layers may be stacked to form the second layer 104.

The third layer 105 is a P-type semiconductor layer. As the third layer 105, the organic compound described in Embodiment Mode 1 which has the absorption peak in a visible light region may be used to form a layer functioning as a P-type semiconductor. The third layer 105 is not limited to a single layer, and a plurality of layers may be stacked to form the third layer 105.

It is preferable that color of the second layer 104 and color of the third layer 105 be complementary. In other words, it is preferable that one of the material constituting the second layer 104 or the material constituting the third layer 105 have the absorption peak in a wavelength region of greater than or equal to 380 nm and less than 540 nm and the other have the absorption peak in a wavelength region of greater than or equal to 540 nm and less than or equal to 760 nm.

More specifically, in the case where a material that has the absorption peak in a wavelength region of greater than or equal to 380 nm and less than 540 nm is used as the second layer 104, it is preferable that a material that has the absorption peak in a wavelength region of greater than or equal to 540 nm and less than or equal to 760 nm be used as the third layer 105. In the case of a combination as the above, for example, 3,4,9,10-perylenetetracarboxylicdianhydride (abbreviation: PTCDA), 3,4,9,10-perylenetetracarboxylicdiimide (abbreviation: PTCDI), N,N'-dimethyl-3,4,9,10-perylenetetracarboxylicdiimide (abbreviation: Me-PTCDI), 1,4,5,8-naphthalenetetracarboxylicdianhydride (abbreviation: NTCDA), 1,4,5,8-naphthalenetetracarboxylicdiimide (abbreviation: NTCDI), or the like may be used as the second layer 104. As the third layer 105, phthalocyanine (abbreviation: H$_2$Pc), copper phthalocyanine (abbreviation: CuPc), zinc phthalocyanine (abbreviation: ZnPc), vanadyl phthalocyanine (abbreviation: VOPc), titanyl phthalocyanine (abbreviation: TiOPc), nickel phthalocyanine (abbreviation: NiPc), pentacene, 6,13-diphenylpentacene, or the like may be used.

Alternatively, in the case where a material that has the absorption peak in a wavelength region of greater than or equal to 540 nm and less than or equal to 760 nm is used as the second layer 104, it is preferable that a material that has the absorption peak in a wavelength region of greater than or equal to 380 nm and less than 540 nm be used as the third layer 105. In the case of a combination as the above, for example, (1,2,3,4,8,9,10,11,15,16,17,18,22,23,24,25-hexadecafluorophthalocyaninato)copper (abbreviation: F$_{16}$—CuPc), (1,2,3,4,8,9,10,11,15,16,17,18,22,23,24,25-hexadecafluorophthalocyaninato)zinc (abbreviation: F$_{16}$—ZnPc), perfluoropentacene, 3,4,9,10-perylenetetracarboxylic-bis-benzimidazole (abbreviation: PTCBI), or the like may be used as the second layer 104. As the third layer 105, naphthacene, 5,12-diphenylnaphthacene, rubrene, or the like may be used.

Due to the structure as the above, a stack of the second layer 104 and the third layer 105 can absorb visible light over a wide wavelength region. In this way, light reflected by the second electrode 106 can be reduced and the contrast of the light emitting element can be improved.

It is to be noted that the N-type semiconductor layer may be further added with a donor material. The conductivity of the N-type semiconductor layer can be increased by addition of a donor material, whereby the driving voltage of the light emitting element can be lowered. As the donor material, an alkali metal, an alkaline earth metal, a rare earth metal, a metal that belongs to Group 13 of the periodic table, or an oxide or carbonate of them may be used. Specifically, lithium (Li), cesium (Cs), magnesium (Mg), calcium (Ca), ytterbium (Yb), indium (In), lithium oxide (LiO$_x$), cesium carbonate (CsCO$_3$), or the like is preferably used.

Furthermore, the P-type semiconductor layer may be further added with an acceptor material. The conductivity of the P-type semiconductor layer can be increased by addition of an acceptor material, whereby the driving voltage of the light emitting element can be lowered. As the acceptor material, 7,7,8,8-tetracyano-2,3,5,6-tetrafluoroquinodimethane (abbreviation: F$_4$-TCNQ), chloranil, or the like can be given. Furthermore, as the acceptor material, a transition metal oxide can be given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable, since it is stable in the air and its hygroscopic property is low so that it can be easily treated.

Furthermore, by using a P-type semiconductor layer to which an acceptor material is added and/or an N-type semiconductor layer to which a donor material is added, an increase of a driving voltage can be suppressed even when the P-type semiconductor layer and/or the N-type semiconductor layer are/is formed to be thick. Accordingly, by forming the P-type semiconductor layer and/or the N-type semiconductor layer to be thick, short-circuiting caused by a minute foreign object, an impact, or the like can be prevented; whereby a light emitting element with a high reliability can be obtained. The film thickness between the electrodes of a general light emitting element is 100 to 150 nm, however, in the case of a light emitting element using the P-type semiconductor layer and the N-type semiconductor layer, it can be 100 to 500 nm, preferably, 200 to 500 nm thick, for example.

In addition, a P-type semiconductor layer to which an acceptor material is added and an N-type semiconductor layer to which a donor material is added have small contact resistance with respect to electrodes. For this reason, the electrode materials can be selected without considering their work functions or the like; therefore, options of the electrode materials are increased.

As the second electrode 106, various metals, an alloy, a conductive compound, a mixture thereof, or the like can be used. An example thereof is indium tin oxide (ITO), indium tin oxide containing silicon or silicon oxide, indium zinc oxide (IZO), indium oxide containing tungsten oxide and zinc oxide (IWZO), or the like. These conductive metal oxide films are generally formed by sputtering. For example, indium zinc oxide (IZO) can be formed by a sputtering method using a target in which zinc oxide of 1 to 20 wt % is added to indium oxide. Indium oxide containing tungsten oxide and zinc oxide (IWZO) can be formed by a sputtering method using a target containing tungsten oxide of 0.5 to 5 wt % and zinc oxide of 0.1 to 1 wt % with respect to indium oxide. Besides these, gold (Au), platinum (Pt), nickel (Ni), tungsten (W), chromium (Cr), molybdenum (Mo), iron (Fe), cobalt (Co), titanium (Ti), copper (Cu), palladium (Pd), aluminum (Al), aluminum-silicon (Al—Si), aluminum-titanium (Al—Ti), aluminum-silicon-copper (Al—Si—Cu), a nitride of the metal material (such as TiN), or the like can be used.

Various methods can be used for forming the first layer 103, the second layer 104, and the third layer 105. For example, a vacuum evaporation method, an ink-jet method, a spin coat method, or the like may be used. Furthermore, each electrode or each layer may be formed by a different film formation method.

The light emitting element of the present invention which has the structure as the above emits light when a current flows due to potential difference generated between the first electrode 102 and the second electrode 106 and holes and electrons are recombined in the first layer 103 that is a layer containing a material with a high light emitting property. That is, the light emitting element of the present invention has a structure in which a light emitting region is formed in the first layer 103.

In the light emitting element shown in FIG. 1, light emission is extracted to external through the first electrode 102. Therefore, the first electrode 102 is formed using a light-transmitting material. Accordingly, light emission is extracted to external through the first electrode 102 from the substrate side.

It is to be noted that the structure of layers provided between the first electrode 102 and the second electrode 106 is not limited to the structure described above. Structures other than the above-described one may be employed as long as a region where holes and electrons are recombined is provided in an area away from the first electrode 102 and the second electrode 106 so as to suppress quenching caused when a light emitting region and a metal are close to each other, and as long as the second layer 104 and the third layer 105 which absorb visible light are provided.

In other words, the layered structure is not particularly limited, and layers each formed of a material with a high electron-transporting property, a material with a high hole-transporting property, a material with a high electron-injecting property, a material with a high hole-injecting property, a bipolar material (a material with high electron-transporting and hole-transporting properties) or the like may be appropriately combined with the second layer 104 and the third layer 105 which absorb visible light. Alternatively, a structure in which a layer formed of a silicon oxide film or the like is provided over the first electrode 102 so as to control a portion where recombination of carriers is performed may be employed.

Figure 2:
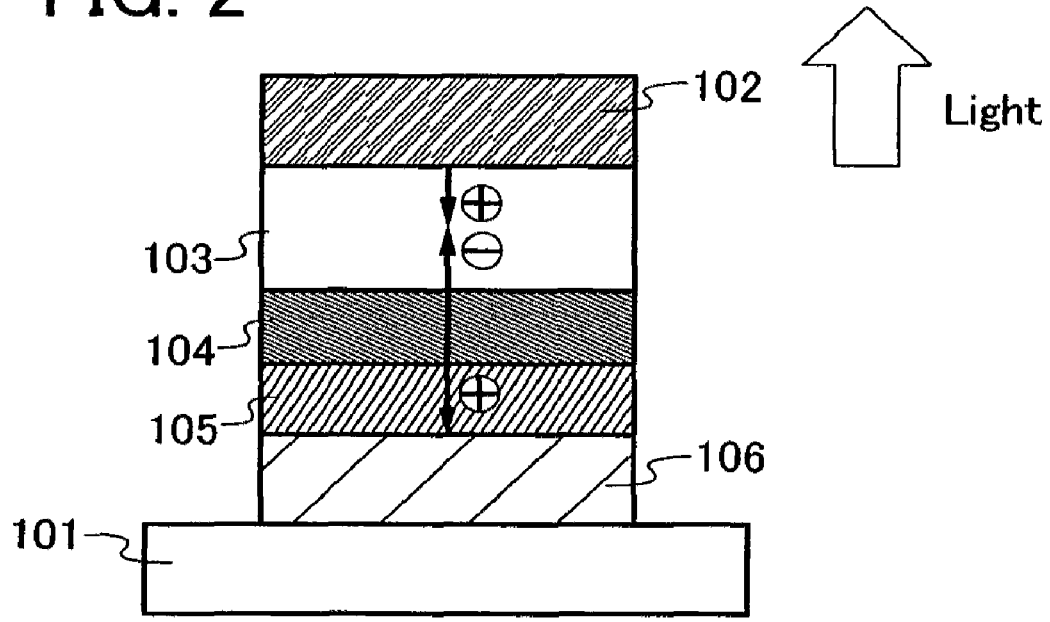
FIG. 2 is a view explaining a light emitting element of the present invention.

Alternatively, a structure in which layers are stacked in the order opposite to that of FIG. 1 and light emission is extracted to external from the side opposite to the substrate may be employed. A light emitting element shown in FIG. 2 has a structure in which the third layer 105 that is a P-type semiconductor layer, the second layer 104 that is an N-type semiconductor layer, the first layer 103 that is a layer containing a light emitting substance, and the first electrode 102 that functions as an anode are stacked in this order over the second electrode 106 that functions as a cathode. In the case where the structure shown in FIG. 2 is employed, light emission from the first layer 103 is extracted to external from the first electrode side which is opposite to the substrate 101.

Figure 8:
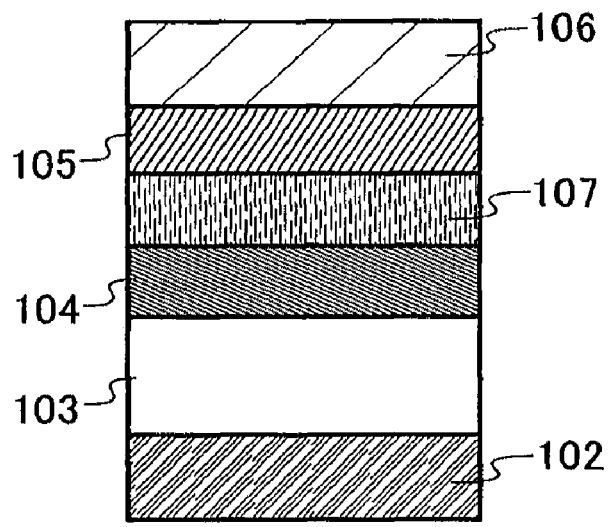
FIG. 8 is a view explaining a light emitting element of the present invention.

Furthermore, as shown in FIG. 8, a fourth layer 107 may be provided between the second layer 104 and the third layer 105. Through provision of the fourth layer 107, the driving voltage can be lowered. As a material for forming the fourth layer 107, a semiconductor material or a conductive material may be used. As the conductive material, for example, indium tin oxide (ITO), indium tin oxide containing silicon or silicon oxide, indium zinc oxide (IZO), indium oxide containing tungsten oxide and zinc oxide (IWZO), or the like can be given. In addition, for example, a film of a metal such as aluminum (Al) or silver (Ag) that is formed to have a thickness of 1 to 50 nm, preferably approximately 5 to 20 nm, so as to have a light-transmitting property may be used. In addition, as the semiconductor material, titanium oxide ($TiO_x$), vanadium oxide ($VO_x$), niobium oxide ($NbO_x$), molybdenum oxide ($MoO_x$), tungsten oxide ($WO_x$), rhenium oxide ($ReO_x$), ruthenium oxide ($RuO_x$), cobalt oxide ($CoO_x$), nickel oxide ($NiO_x$), zinc oxide ($ZnO_x$), copper oxide ($CuO_x$), tin oxide ($SnO_x$), zinc sulfide (ZnS), gallium nitride (GaN), gallium aluminum nitride (AlGaN), or the like is given.

In this embodiment mode, the light emitting element is manufactured over a substrate of glass, plastic, or the like. By manufacturing a plurality of light emitting elements like this over one substrate, a passive light emitting device can be manufactured. In addition, a thin film transistor (TFT) may be formed over a substrate of glass, plastic, or the like and a light emitting element may be manufactured over an electrode that is electrically connected to the TFT. In this way, an active matrix light emitting device in which the TFT controls the drive of the light emitting element can be manufactured. It is to be noted that the structure of the TFT is not particularly limited. A staggered TFT or an inversely staggered TFT may be employed. In addition, a driver circuit formed over a TFT substrate may be formed using N-type and P-type TFTs, or using either N-type or P-type TFTs. Crystallinity of a semiconductor film used for the TFT is not particularly limited, either. An amorphous semiconductor film may be used, or a crystalline semiconductor film may be used.

A light emitting element of the present invention has the second layer 104 and the third layer 105 which absorb visible light between the light emitting layer and the second electrode. Accordingly, light reflected by the second electrode can be reduced and the contrast can be improved.

Furthermore, optical design of the light emitting element of the present invention can be performed without considering light reflected by the second electrode, which means that the optical design can be performed more easily.

Furthermore, the P-type semiconductor layer and the N-type semiconductor layer used for the light emitting element of the present invention can be formed by vacuum evaporation. When a layer containing a light emitting substance is formed by vacuum evaporation, any of the layers can be formed in the same vacuum device, and the light emitting element can be formed in a consistent vacuum. Accordingly, attachment of a minute foreign object in the manufacturing process can be prevented and a yield can be improved.

This embodiment mode can be appropriately combined with other embodiment modes.

Embodiment Mode 3

In this embodiment mode, a light emitting element that has a different structure from the structure described in Embodiment Mode 2 will be described with reference to FIG. 3.

In this mode, the light emitting element includes a first electrode 302, a first layer 303, a second layer 304, and a third layer 305 that are stacked over the first electrode 302 in order, and a second electrode 306 provided thereover. It is to be noted that the description will be made below regarding the first electrode 302 as a cathode and the second electrode 306 as an anode, in this mode.

The substrate 301 is used as a base of the light emitting element. As the substrate 301, glass, plastic, or the like may be used, for example. Other materials than those may be used, as long as the materials function as a base in the process of manufacturing the light emitting element.

It is preferable that the first electrode 302 be an electrode with a high light-transmitting property. In addition, a metal, an alloy, a conductive compound, or a mixture thereof, each of which has a low work function (specifically, 3.8 eV or less), or the like is preferably used. Specifically, an element that belongs to Group 1 or Group 2 of the periodic table, that is, an alkali metal such as lithium (Li) or cesium (Cs), an alkaline earth metal such as magnesium (Mg), calcium (Ca), or strontium (Sr), an alloy containing these (such as an MgAg alloy or an AlLi alloy), or the like may be used to form a thin film so as to transmit light, as the first electrode 302. Alternatively, a stack of a metal thin film and a transparent conductive film (indium tin oxide (ITO), indium tin oxide containing silicon or silicon oxide, indium zinc oxide (IZO), indium oxide containing tungsten oxide and zinc oxide (IWZO), or the like) can be used. For example, a film of an AlLi alloy, an MgAg alloy, or the like which is formed with a thickness of 1 to 50 nm, preferably approximately 5 to 20 nm, can be used as the first electrode 302.

The first layer 303 is a layer that contains a light emitting substance. The first layer 303 may be structured as a single layer, or a plurality of layers may be stacked to form the first layer 303. The layered structure is not particularly limited, and layers each formed of a material with a high electron-transporting property, a material with a high hole-transporting property, a material with a high electron-injecting property, a material with a high hole-injecting property, a bipolar material (a material with high electron-transporting and hole-transporting properties) or the like may be appropriately combined. For example, a hole-injecting layer, a hole-transporting layer, a hole-blocking layer, a light emitting layer, an electron-transporting layer, an electron-injecting layer, and the like may be appropriately combined to constitute the first layer 103. Specific materials to form each of the layers will be given below.

The electron-injecting layer is a layer containing a material with a high electron-injecting property. As the material with a high electron-injecting property, the materials shown in Embodiment Mode 2 may be used. Specifically, an alkali metal, an alkaline earth metal, or a compound thereof such as lithium fluoride (LiF), cesium fluoride (CsF), or calcium fluoride ($CaF_2$) may be used. For example, a layer of a material having an electron-transporting property containing an alkali metal, an alkaline earth metal, or a compound thereof, such as Alq which contains magnesium (Mg), may be used. As an electron-injecting layer, by using a layer of a material having an electron-transporting property containing an alkali metal or an alkaline earth metal, a material for forming an electrode can be selected without depending on a work function of the electrode. In other words, not only a material with a low work function but also a material with a high work function may be used as the first electrode 302.

The electron-transporting layer is a layer containing a material with a high electron-transporting property. As the material with a high electron-transporting property, the materials shown in Embodiment Mode 2 may be used.

The light emitting layer is a layer containing a material with a high light emitting property, and various materials may be used for the light emitting layer. Specifically, the materials shown in Embodiment Mode 2 may be used.

The hole-transporting layer is a layer containing a material with a high hole-transporting property. As the material with a high hole-transporting property, the materials shown in Embodiment Mode 2 may be used.

In addition, the hole-injecting layer may be provided. As a material for forming the hole-injecting layer, the materials shown in Embodiment Mode 2 may be used.

The second layer 304 is a P-type semiconductor layer. As the second layer 304, the organic compound that has the absorption peak in a visible light region shown in Embodiment Mode 1 may be used so as to form a layer functioning as a P-type semiconductor. The second layer 304 is not limited to a single layer, and may have a structure in which a plurality of layers is stacked.

The third layer 305 is an N-type semiconductor layer. As the third layer 305, the organic compound that has the absorption peak in a visible light region shown in Embodiment Mode 1 may be used so as to form a layer functioning as an N-type semiconductor. The third layer 305 is not limited to a single layer, and may have a structure in which a plurality of layers is stacked.

It is preferable that color of the second layer 304 and color of the third layer 305 be complementary. In other words, it is preferable that one of the material constituting the second layer 304 or the material constituting the third layer 305 have the absorption peak in a wavelength region of greater than or equal to 380 nm and less than 540 nm and the other have the absorption peak in a wavelength region of greater than or equal to 540 nm and less than or equal to 760 nm.

More specifically, in the case where a material that has the absorption peak in a wavelength region of greater than or equal to 380 nm and less than 540 nm is used as the second layer 304, it is preferable that a material that has the absorption peak in a wavelength region of greater than or equal to 540 nm and less than or equal to 760 nm be used as the third layer 305. In the case of a combination as the above, for example, naphthacene, 5,12-diphenylnaphthacene, rubrene, or the like may be used for the second layer 304. As the third layer 305, (1,2,3,4,8,9,10,11,15,16,17,18,22,23,24,25-hexadecafluorophthalocyaninato)copper (abbreviation: $F_{16}$—CuPc), (1,2,3,4,8,9,10,11,15,16,17,18,22,23,24,25-hexadecafluorophthalocyaninato)zinc (abbreviation: $F_{16}$—ZnPc), 3,4,9,10-perylenetetracarboxylic-bis-benzimidazole (abbreviation: PTCBI), perfluoropentacene, or the like may be used.

Alternatively, in the case where a material that has the absorption peak in a wavelength region of greater than or equal to 540 nm and less than or equal to 760 nm is used as the second layer 304, it is preferable that a material that has the absorption peak in a wavelength region of greater than or equal to 380 nm and less than 540 nm be used as the third layer 305. In the case of a combination as the above, for example, phthalocyanine (abbreviation: $H_2Pc$), copper phthalocyanine (abbreviation: CuPc), zinc phthalocyanine (abbreviation: ZnPc), vanadyl phthalocyanine (abbreviation: VOPc), titanyl phthalocyanine (abbreviation: TiOPc), nickel phthalocyanine (abbreviation: NiPc), pentacene, 6,13-diphenylpentacene, or the like may be used for the second layer 304. For the third layer 305, 3,4,9,10-perylenetetracarboxylicdianhydride (abbreviation: PTCDA), 3,4,9,10-perylenetetracarboxylicdiimide (abbreviation: PTCDI), N,N'-dimethyl-3,4,9,10-perylenetetracarboxylicdiimide (abbreviation: Me-PTCDI), 1,4,5,8-naphthalenetetracarboxylicdianhydride (abbreviation: NTCDA), 1,4,5,8-naphthalenetetracarboxylicdiimide (abbreviation: NTCDI), or the like may be used.

Due to the structure as the above, a stack of the second layer 304 and the third layer 305 can absorb light emitted from the first layer 303. In this way, light reflected by the second electrode 306 can be reduced and the contrast of the light emitting element can be improved.

It is to be noted that the N-type semiconductor layer may be further added with a donor material. The conductivity of the N-type semiconductor layer can be increased by addition of a donor material, whereby the driving voltage of the light emitting element can be lowered. As the donor material, an alkali metal, an alkaline earth metal, a rare earth metal, a metal that belongs to Group 13 of the periodic table, or an oxide or carbonate of them may be used. Specifically, lithium (Li), cesium (Cs), magnesium (Mg), calcium (Ca), ytterbium (Yb), indium (In), lithium oxide ($LiO_x$), cesium carbonate ($CsCO_3$), or the like is preferably used.

Furthermore, the P-type semiconductor layer may be further added with an acceptor material. The conductivity of the P-type semiconductor layer can be increased by addition of an acceptor material, whereby the driving voltage of the light emitting element can be lowered. Furthermore, contact resistance of electrodes can be reduced by addition of the acceptor material. For this reason, the electrode materials can be selected without considering their work functions or the like; therefore, options of the electrode materials are increased. As the acceptor material, 7,7,8,8-tetracyano-2,3,5,6-tetrafluoroquinodimethane (abbreviation: $F_4$-TCNQ), chloranil, or the like can be given. Furthermore, as the acceptor material, a transition metal oxide can be given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable, since it is stable in the air and its hygroscopic property is low so that it can be easily treated.

Furthermore, by using a P-type semiconductor layer to which an acceptor material is added and/or an N-type semiconductor layer to which a donor material is added, an increase of a driving voltage can be suppressed even when the P-type semiconductor layer and/or the N-type semiconductor layer are/is formed to be thick. Accordingly, by forming the P-type semiconductor layer and/or the N-type semiconductor layer to be thick, short-circuiting caused by a minute foreign object, an impact, or the like can be prevented; whereby a light emitting element with a high reliability can be obtained. The film thickness between the electrodes of a general light emitting element is 100 to 150 nm, however, in the case of a light emitting element using the P-type semiconductor layer and the N-type semiconductor layer, it can be 100 to 500 nm, preferably, 200 to 500 nm thick, for example.

In addition, a P-type semiconductor layer to which an acceptor material is added and an N-type semiconductor layer to which a donor material is added have small contact resistance with respect to electrodes. For this reason, the electrode materials can be selected without considering their work functions or the like; therefore, options of the electrode materials are increased.

As the second electrode 306, various metals, an alloy, a conductive compound, or a mixed metal, compound, or alloy thereof can be used. An example thereof is indium tin oxide (ITO), indium tin oxide containing silicon or silicon oxide, indium zinc oxide (IZO), indium oxide containing tungsten oxide and zinc oxide (IWZO), or the like. These conductive metal oxide films are generally formed by sputtering. For example, indium zinc oxide (IZO) can be formed by a sputtering method using a target in which zinc oxide of 1 to 20 wt % is added to indium oxide. Indium tin oxide containing tungsten oxide and zinc oxide (IWZO) can be formed by a sputtering method using a target containing tungsten oxide of 0.5 to 5 wt % and zinc oxide of 0.1 to 1 wt % with respect to indium oxide. Besides these, gold (Au), platinum (Pt), nickel (Ni), tungsten (W), chromium (Cr), molybdenum (Mo), iron (Fe), cobalt (Co), titanium (Ti), copper (Cu), palladium (Pd), aluminum (Al), aluminum-silicon (Al—Si), aluminum-titanium (Al—Ti), aluminum-silicon-copper (Al—Si—Cu), a nitride of the metal material (such as TiN), or the like can be used.

The method for forming the first layer 303, the second layer 304, and the third layer 305 may be other than the above-described evaporation method. For example, an ink-jet method, a spin coat method, or the like may be used. Furthermore, each electrode or each layer may be formed by a different film formation method.

The light emitting element of the present invention which has the structure as the above emits light when a current flows due to potential difference generated between the first electrode 302 and the second electrode 306 and holes and electrons are recombined in the first layer 303 that is a layer containing a material with a high light emitting property. That is, the light emitting element of the present invention has a structure in which a light emitting region is formed in the first layer 303.

Figure 3:
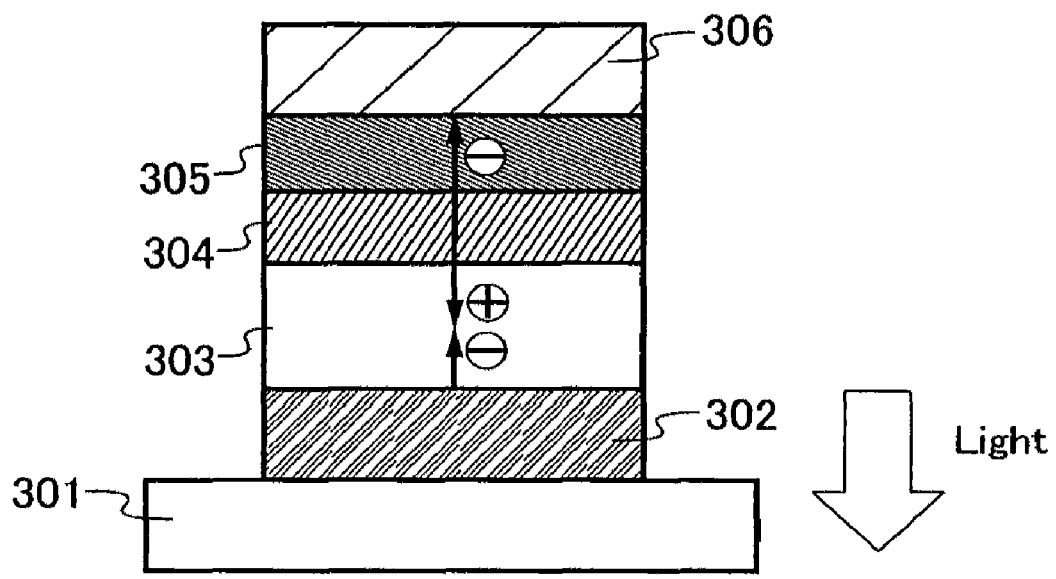
FIG. 3 is a view explaining a light emitting element of the present invention.

In the light emitting element shown in FIG. 3, light emission is extracted to external through the first electrode 302. Therefore, the first electrode 302 is formed using a light-transmitting material. Accordingly, light emission is extracted to external through the first electrode 302 from the substrate side.

It is to be noted that the structure of layers provided between the first electrode 302 and the second electrode 306 is not limited to the structure described above. Structures other than the above-described one may be employed as long as a region where holes and electrons are recombined is provided in an area away from the first electrode 302 and the second electrode 306 so as to suppress quenching caused when a light emitting region and a metal are close to each other, and as long as the second layer 304 and the third layer 305 which absorb visible light are provided.

In other words, the layered structure is not particularly limited, and layers each formed of a material with a high electron-transporting property, a material with a high hole-transporting property, a material with a high electron-injecting property, a material with a high hole-injecting property, a bipolar material (a material with high electron-transporting and hole-transporting properties) and the like may be appropriately combined with the second layer 304 and the third layer 305 which absorb visible light. Alternatively, a structure in which a layer formed of a silicon oxide film or the like is provided over the first electrode 302 so as to control a portion where recombination of carriers is performed may be employed.

Figure 4:
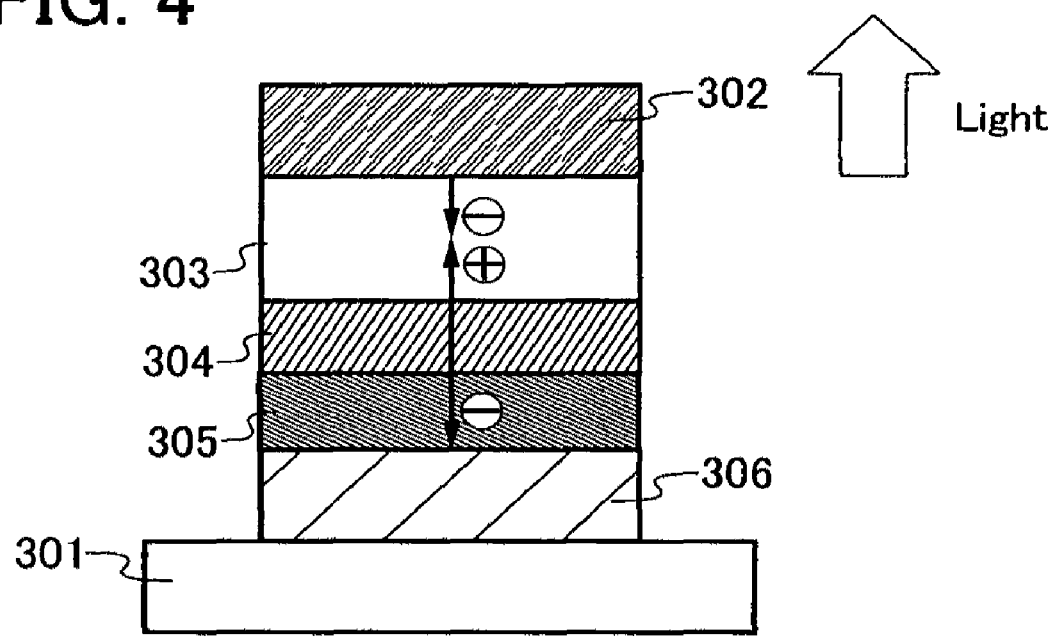
FIG. 4 is a view explaining a light emitting element of the present invention.

Alternatively, a structure in which layers are stacked in the order opposite to that of FIG. 3 and light emission is extracted to external from the side opposite to the substrate may be employed. A light emitting element shown in FIG. 4 has a structure in which the third layer 305 that is an N-type semiconductor layer, the second layer 304 that is a P-type semiconductor layer, the first layer 303 that is a layer containing a light emitting substance, and the first electrode 302 that functions as a cathode are stacked in this order over the second electrode 306 that functions as an anode. In the case where the structure shown in FIG. 4 is employed, light emission from the first layer 303 is extracted to external from the first electrode side which is opposite to the substrate 301.

Figure 9:
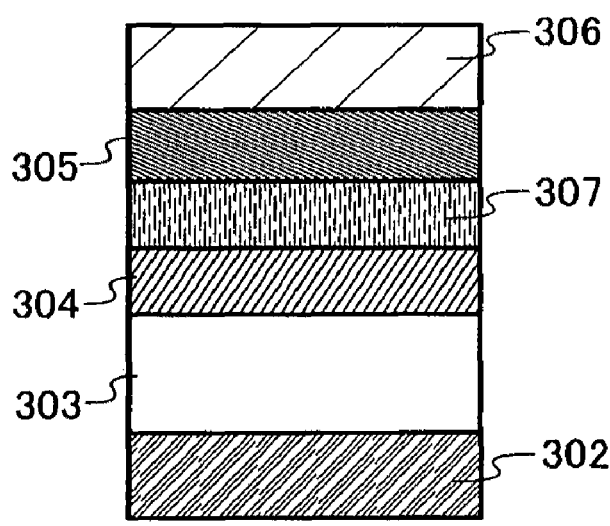
FIG. 9 is a view explaining a light emitting element of the present invention.

Furthermore, as shown in FIG. 9, a fourth layer 307 may be provided between the second layer 304 and the third layer 305. Through provision of the fourth layer 307, the driving voltage can be lowered. As a material for forming the fourth layer 307, a semiconductor material or a conductive material may be used. As the conductive material, for example, indium tin oxide (ITO), indium tin oxide containing silicon or silicon oxide, indium zinc oxide (IZO), indium oxide containing tungsten oxide and zinc oxide (IWZO), or the like can be given. In addition, for example, a film of a metal such as aluminum (Al) or silver (Ag) that is formed to have a thickness of 1 to 50 nm, preferably approximately 5 to 20 nm, so as to have a light-transmitting property may be used. In addition, as the semiconductor material, titanium oxide ($TiO_x$), vanadium oxide ($VO_x$), niobium oxide ($NbO_x$), molybdenum oxide ($MoO_x$), tungsten oxide ($WO_x$), rhenium oxide ($ReO_x$), ruthenium oxide ($RuO_x$), cobalt oxide ($CoO_x$), nickel oxide ($NiO_x$), zinc oxide ($ZnO_x$), copper oxide ($CuO_x$), tin oxide ($SnO_x$), zinc sulfide (ZnS), gallium nitride (GaN), gallium aluminum nitride (AlGaN), or the like is given.

A light emitting element of the present invention has the second layer 304 and the third layer 305 which absorb visible light between the light emitting layer and the second electrode. Accordingly, light reflected by the second electrode can be reduced and the contrast can be improved.

Furthermore, optical design of the light emitting element of the present invention can be performed without considering light reflected by the second electrode, which means that the optical design can be performed more easily.

Furthermore, the P-type semiconductor layer and the N-type semiconductor layer used for the light emitting element of the present invention can be formed by vacuum evaporation. When a layer containing a light emitting substance is formed by vacuum evaporation, any of the layers can be formed in the same vacuum device, and the light emitting element can be formed in a consistent vacuum. Accordingly, attachment of a minute foreign object in the manufacturing process can be prevented and a yield can be improved.

This embodiment mode can be appropriately combined with other embodiment modes.

Embodiment Mode 4

In this embodiment mode, a light emitting device including a light emitting element of the present invention will be described.

Figure 5A:
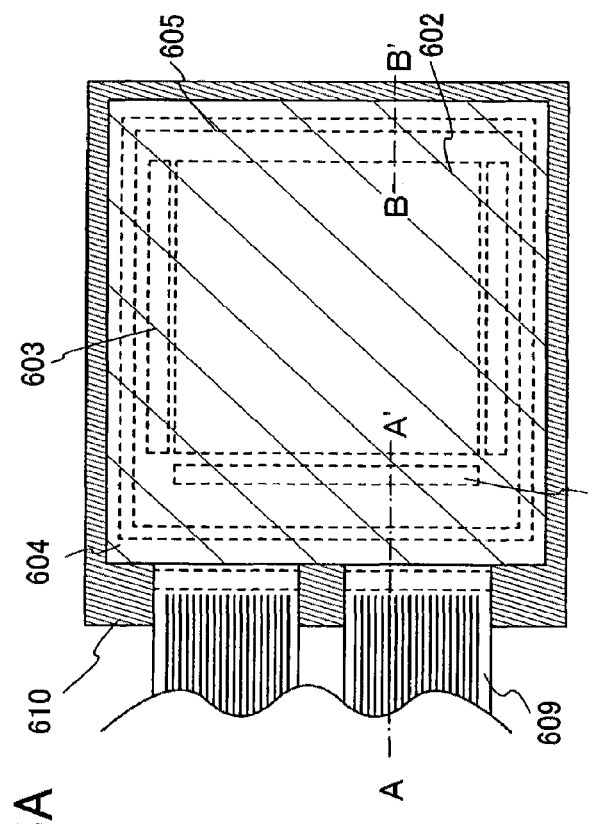
FIGS. 5A and 5B are views each explaining a light emitting device of the present invention.
Figure 5B:
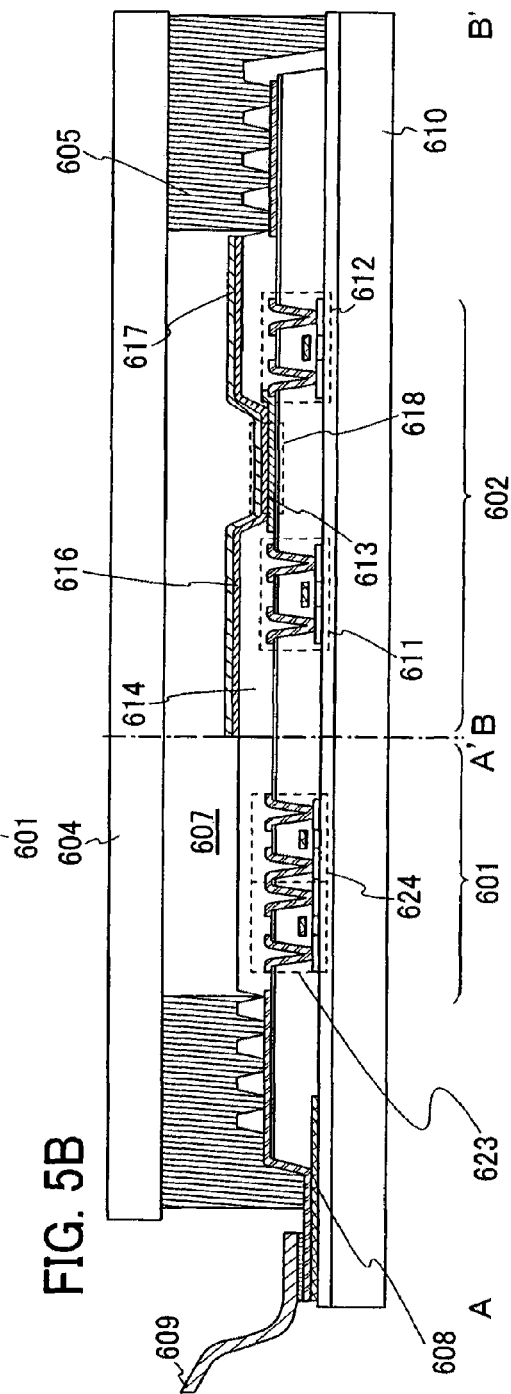

In this embodiment mode, a light emitting device including a light emitting element of the present invention in the pixel portion will be described with reference to FIGS. 5A and 5B. FIG. 5A is a top view showing a light emitting device, and FIG. 5B is a cross-sectional view along a line A-A' and a line B-B' of FIG. 5A. Reference numeral 601 denotes a driver circuit portion (source driver circuit), 602 denotes a pixel portion, and 603 denotes a driver circuit portion (gate driver circuit), each of which is shown by a dotted line. Reference numeral 604 denotes a sealing substrate, 605 denotes a sealing member, and 607 denotes a space surrounded by the sealing member 605.

A lead wire 608 is a wire for transmitting signals to be input to the source driver circuit 601 and the gate driver circuit 603, and receives a video signal, a clock signal, a start signal, a reset signal, and the like from an FPC (Flexible Printed Circuit) 609 that is an external input terminal. Although only the FPC is shown here, a printed wiring board (PWB) may be attached to the FPC. The light emitting device in this specification includes not only the light emitting device itself, but also a state where the FPC or the PWB is attached to the light emitting device.

Next, a cross-sectional structure will be described with reference to FIG. 5B. Although the driver circuit portions and the pixel portion are formed over an element substrate 610, FIG. 5B shows the source driver circuit 601 that is the driver circuit portion and one pixel in the pixel portion 602.

The source driver circuit 601 includes a CMOS circuit formed by combining an N-channel TFT 623 and a P-channel TFT 624. Alternatively, the driver circuit may be formed using a CMOS circuit, a PMOS circuit, or an NMOS circuit. In this embodiment mode, the integrated driver circuit that is formed over the substrate is shown; however, the driver circuit is not necessarily formed over the substrate and may be formed outside the substrate.

The pixel portion 602 includes a plurality of pixels each having a switching TFT 611, a current controlling TFT 612, and a first electrode 613 that is electrically connected to a drain of the current controlling TFT 612. An insulator 614 is formed to cover an edge portion of the first electrode 613. In this embodiment mode, the insulator 614 is formed of a positive photosensitive acrylic resin film.

In order to improve coverage, an upper edge portion or a lower edge portion of the insulator 614 is formed so as to have a curved surface with curvature. For example, if positive photosensitive acrylic is used for the insulator 614, it is preferable that only the upper edge portion of the insulator 614 have a curved surface with a radius of curvature of 0.2 to 3 μm. Either a negative type which becomes insoluble in an etchant by light irradiation or a positive type which becomes soluble in an etchant by light irradiation can be used as the insulator 614.

A layer 616 containing a light emitting substance and a second electrode 617 are formed over the first electrode 613. The first electrode 613 can be made of various metals, an alloy, a conductive compound, or a mixture metal, compound, or alloy thereof. If the first electrode is used as an anode, it is preferable to use, among those materials, a metal, an alloy, a conductive compound, a mixture thereof, or the like with a high work function (work function of 4.0 eV or higher), or the like. For example, it is possible to use a single layer film of indium tin oxide containing silicon, indium zinc oxide, a titanium nitride film, a chromium film, a tungsten film, a Zn film, a Pt film, or the like. It is also possible to use a stacked layer structure of a film containing titanium nitride and a film mainly containing aluminum; a three-layer structure of a titanium nitride film, a film mainly containing aluminum, and a titanium nitride film; or the like. The stacked layer structure achieves to have a low wire resistance, favorable ohmic contact, and a function as an anode.

The layer 616 containing a light emitting substance is formed by various methods such as an evaporation method using an evaporation mask, an ink-jet method, and a spin coat method. The layer 616 containing a light emitting substance includes the layer that absorbs visible light and the light emitting layer shown in Embodiment Mode 1. As another material that constitutes the layer 616 containing a light emitting substance, a low-molecular compound or a high-molecular compound (such as oligomer, dendrimer, or polymer) may be used. As the material for the layer containing a light emitting substance, not only an organic compound but also an inorganic compound may be used.

As a material used for the second electrode 617, various metals, an alloy, a conductive compound, or a mixed metal, compound, or alloy thereof may be used. In the case where the second electrode is used as a cathode, a metal, an alloy, a conductive compound, a mixture thereof, or the like with a low work function (a work function of 3.8 eV or lower) is preferably used, among others. For example, an element that belongs to Group 1 or 2 of the periodic table, that is, an alkali metal such as lithium (Li) or cesium (Cs), an alkaline earth metal such as magnesium (Mg), calcium (Ca), or strontium (Sr), an alloy containing these (Mg:Ag, Al:Li), or the like can be given. If light generated in the layer 616 containing a light emitting substance is transmitted through the second electrode 617, the second electrode 617 can be formed using a stacked layer structure of a metal thin film and a transparent conductive film (indium tin oxide (ITO), indium tin oxide containing silicon or silicon oxide, indium zinc oxide (IZO), indium oxide containing tungsten oxide and zinc oxide (IWZO), or the like).

When the sealing substrate 604 and the element substrate 610 are attached to each other with the sealing member 605, the light emitting element 618 is provided in the space 607 surrounded by the element substrate 610, the sealing substrate 604, and the sealing member 605. The space 607 may be filled with filler, and may be filled with an inert gas (such as nitrogen and argon), the sealing member 605, or the like.

An epoxy-based resin is preferably used for the sealing member 605. The material preferably allows as little moisture and oxygen as possible to penetrate. As a material for the sealing substrate 604, a plastic substrate made of FRP (Fiber-glass-Reinforced Plastics), PVF (polyvinyl fluoride), Mylar, polyester, acrylic, or the like can be used besides a glass substrate or a quartz substrate.

In this manner, the light emitting device including the light emitting element of the present invention can be obtained.

The light emitting device of the present invention has the layer that absorbs visible light described in Embodiment Mode 1. Accordingly, light reflected by an electrode can be reduced and the contrast can be improved.

Furthermore, optical design of the light emitting device of the present invention can be performed without considering light reflected by the second electrode, which means that the optical design can be performed more easily.

Furthermore, by using a P-type semiconductor layer to which an acceptor material is added and/or an N-type semiconductor layer to which a donor material is added, an increase of a driving voltage can be suppressed even when the P-type semiconductor layer and/or the N-type semiconductor layer are/is formed to be thick. Accordingly, by forming the P-type semiconductor layer and/or the N-type semiconductor layer to be thick, short-circuiting caused by a minute foreign object, an impact, or the like can be prevented; whereby a light emitting element with a high reliability can be obtained. The film thickness between the electrodes of a general light emitting element is 100 to 150 nm, however, in the case of a light emitting element using the P-type semiconductor layer and the N-type semiconductor layer, it can be 100 to 500 nm, preferably, 200 to 500 nm thick, for example.

In addition, a P-type semiconductor layer to which an acceptor material is added and an N-type semiconductor layer to which a donor material is added have small contact resistance with respect to electrodes. For this reason, the electrode materials can be selected without considering their work functions or the like; therefore, options of the electrode materials are increased.

Furthermore, the light emitting device of the present invention can improve the contrast without using a polarizing plate, a quarter-wave plate, or the like outside of the light emitting element. For this reason, the contrast can be improved without an increase in the number of manufacturing steps. In addition, since the polarizing plate or the quarter-wave plate is not necessarily used, a light emitting element with a high contrast can be manufactured at low costs.

Figure 6:
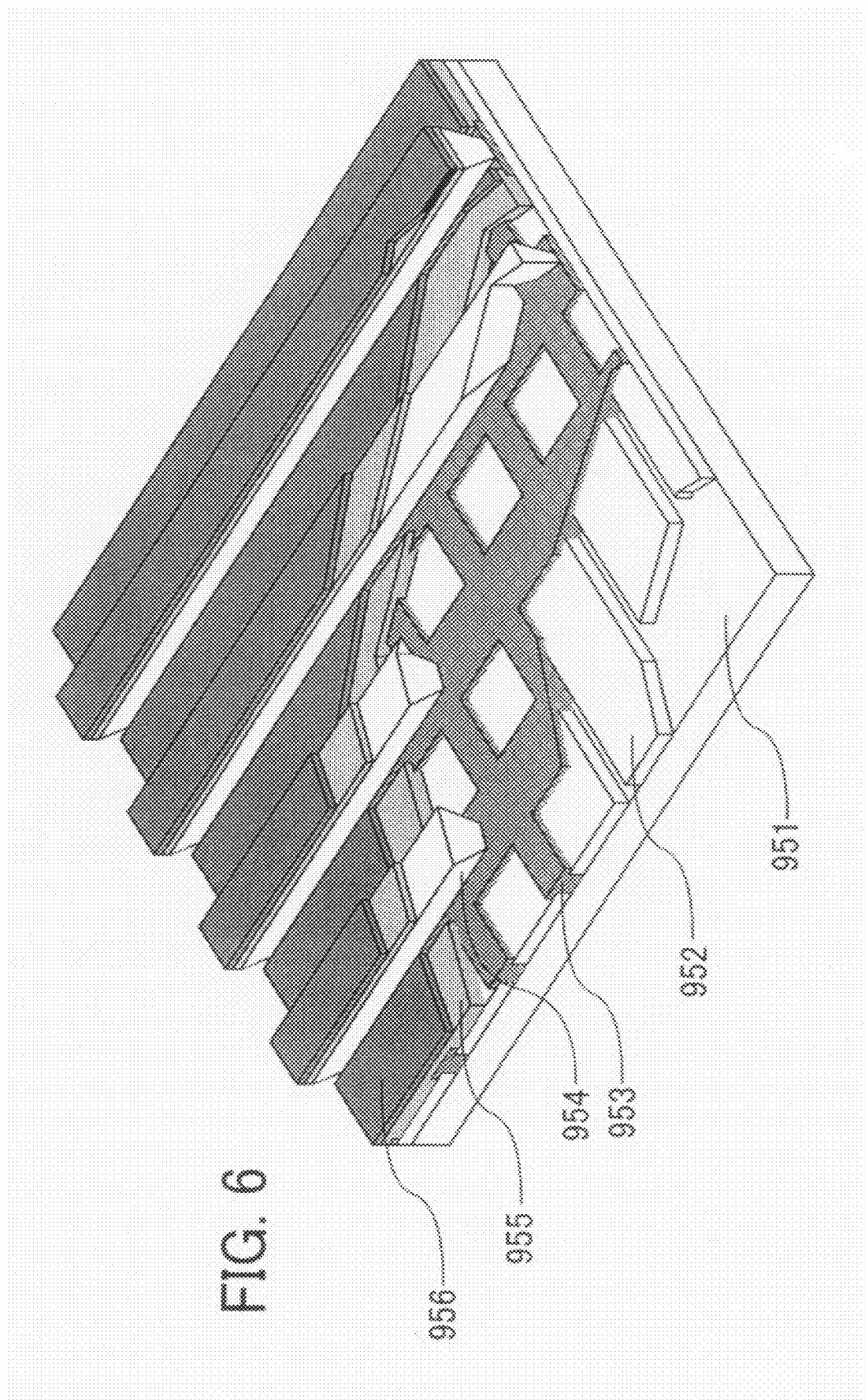
FIG. 6 is a view explaining a light emitting device of the present invention.

As the above, an active light emitting device in which the drive of a light emitting element is controlled by a transistor is described in this embodiment mode. However, the present invention may also be a passive light emitting device in which a light emitting element is driven without a driving element such as a transistor. FIG. 6 shows a perspective view of a passive light emitting device that is manufactured by applying the present invention. In FIG. 6, a layer 955 containing a light emitting substance is provided between an electrode 952 and an electrode 956 over a substrate 951. An edge portion of the electrode 952 is covered with an insulating layer 953. In addition, a partition layer 954 is provided over the insulating layer 953. Sidewalls of the partition layer 954 are inclined such that a distance between one sidewall and the other sidewall becomes narrower as the sidewalls gets closer to the substrate surface. In other words, a cross section of the partition layer 954 in a direction of short side is trapezoidal shape of which the lower base (the side facing in the same direction as the plane direction of the insulating layer 953 and being in contact with the insulating layer 953) is shorter than the upper base (the side facing in the same direction as the plane direction of the insulating layer 953 and not being in contact with the insulating layer 953). In this way, with the provision of the partition layer 954, defects of the light emitting element caused by a static electricity or the like can be prevented. Furthermore, even a passive light emitting device can achieve a high contrast when it includes the light emitting element of the present invention with a high contrast.

Embodiment Mode 5

In this embodiment mode, an electronic device of the present invention which includes the light emitting device described in Embodiment Mode 4 in a portion thereof will be described. The electronic device of the present invention has a display portion excellent in contrast which includes the layer that absorbs visible light described in Embodiment Mode 1. In addition, it is also possible to provide an electronic device having a display portion with high reliability in which short-circuiting caused by a minute foreign object, an impact from an external source, or the like is suppressed by making the layer that absorbs visible light described in Embodiment Mode 1 to be thick.

Examples of the electronic device manufactured by using the light emitting device of the present invention are as follows: a camera such as a video camera or a digital camera, a goggle type display, a navigation system, a sound reproducing device (a car audio system, an audio component, or the like), a computer, a game machine, a portable information terminal (a mobile computer, a cellular phone, a mobile game machine, an electronic book, or the like), an image reproducing device having a recording medium (specifically, a device for reproducing a recording medium such as a digital versatile disc (DVD) and having a display for displaying the image), and the like. Specific examples of these electronic devices are shown in FIGS. 7A to 7D.

Figure 7A:
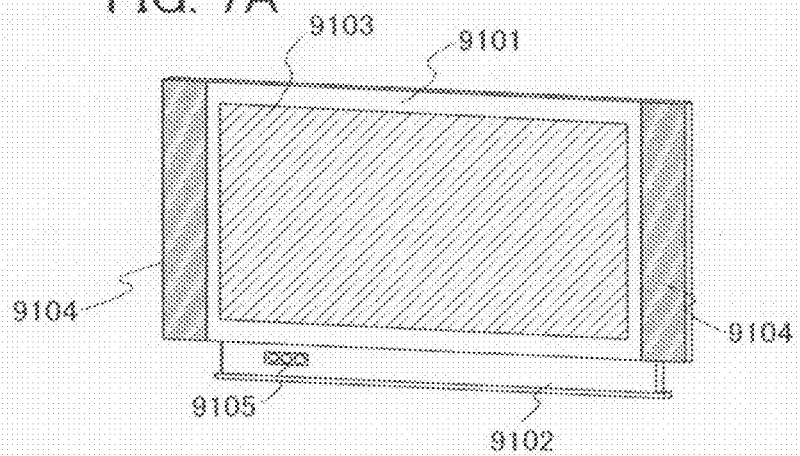
FIGS. 7A to 7D are views each explaining an electronic device of the present invention.

FIG. 7A shows a television device according to the present invention, which includes a chassis 9101, a support base 9102, a display portion 9103, a speaker portion 9104, a video input terminal 9105, and the like. In this television device, the display portion 9103 includes light emitting elements similar to those described in Embodiment Modes 2 and 3, which are arranged in a matrix. The light emitting element is excellent in contrast. In addition, short-circuiting caused by a minute foreign object, an impact from an external source, or the like can be prevented. The display portion 9103 which includes the light emitting element also has a similar feature. Accordingly, the television device can realize a high contrast and display a high-quality image. In addition, the television device of the present invention can realize a high contrast even when the number of its components is smaller than the conventional case; therefore it can be manufactured at low costs. Furthermore, when the number of components is reduced, reductions in size and weight of the chassis 9101 can be achieved. Since an improvement in image quality and reductions in size and weight are achieved in the television device of the present invention, a product which is suitable for the living environment can be provided.

Figure 7B:
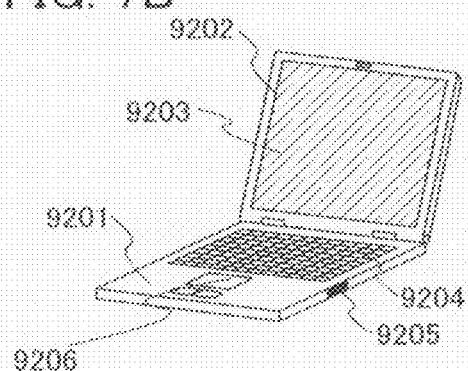

FIG. 7B shows a computer according to the present invention, which includes a main body 9201, a chassis 9202, a display portion 9203, a keyboard 9204, an external connection port 9205, a pointing mouse 9206, and the like. In this computer, the display portion 9203 includes light emitting elements similar to those described in Embodiment Modes 2 and 3, which are arranged in a matrix. The light emitting element is excellent in contrast. In addition, short-circuiting caused by a minute foreign object, an impact from an external source, or the like can be prevented. The display portion 9203 which includes the light emitting element also has a similar feature. Accordingly, the computer can realize a high contrast and display a high-quality image. In addition, the computer of the present invention can realize a high contrast even when the number of its components is smaller than the conventional case; therefore it can be manufactured at low costs. Furthermore, when the number of components is reduced, reductions in size and weight of the chassis 9202 can be achieved. Since an improvement in image quality and reductions in size and weight are achieved in the computer of the present invention, a product which is suitable for the environment can be provided. In addition, a portable computer can be provided.

Figure 7C:
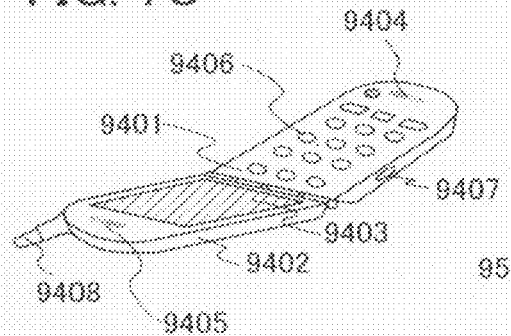

FIG. 7C shows a cellular phone according to the present invention, which includes a main body 9401, a chassis 9402, a display portion 9403, an audio input portion 9404, an audio output portion 9405, an operation key 9406, an external connection port 9407, an antenna 9408, and the like. In this cellular phone, the display portion 9403 includes light emitting elements similar to those described in Embodiment Modes 2 and 3, which are arranged in a matrix. The light emitting element is excellent in contrast. In addition, short-circuiting caused by a minute foreign object, an impact from an external source, or the like can be prevented. The display portion 9403 which includes the light emitting element also has a similar feature. Accordingly, the cellular phone can realize a high contrast and display a high-quality image. In addition, the cellular phone of the present invention can realize a high contrast even when the number of its components is smaller than the conventional case; therefore it can be manufactured at low costs. Furthermore, when the number of components is reduced, reductions in size and weight of the chassis 9402 can be achieved. Since an improvement in image quality and reductions in size and weight are achieved in the cellular phone of the present invention, a product which is suitable for being carried can be provided. In addition, a product including a display portion resistant to an impact from an external source when being carried can be provided.

Figure 7D:
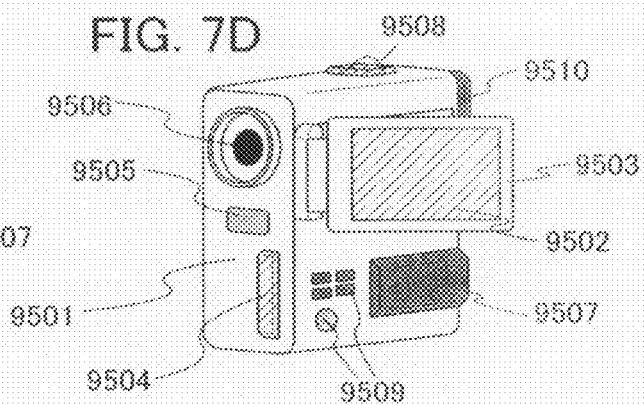

FIG. 7D shows a camera according to the present invention, which includes a main body 9501, a display portion 9502, a chassis 9503, an external connection port 9504, a remote control receiving portion 9505, an image receiving portion 9506, a battery 9507, an audio input portion 9508, operation keys 9509, an eye piece portion 9510, and the like. In this camera, the display portion 9502 includes light emitting elements similar to those described in Embodiment Modes 2 and 3, which are arranged in a matrix. The light emitting element is excellent in contrast. In addition, short-circuiting caused by a minute foreign object, an impact from an external source, or the like can be prevented. The display portion 9502 which includes the light emitting element also has a similar feature. Accordingly, the camera can realize a high contrast and display a high-quality image. In addition, the camera of the present invention can realize a high contrast even when the number of its components is smaller than the conventional case; therefore it can be manufactured at low costs. Furthermore, when the number of components is reduced, reductions in size and weight of the chassis 9503 can be achieved. Since an improvement in image quality and reductions in size and weight are achieved in the camera of the present invention, a product which is suitable for being carried can be provided. In addition, a product including a display portion resistant to an impact from an external source when being carried can be provided.

As described above, the applicable range of the light emitting device of the present invention is so wide that the light emitting device can be applied to electronic devices of various fields. By using the light emitting device of the present invention, an electronic device including a display portion with a high contrast can be provided.

Embodiment 1

Figure 10:
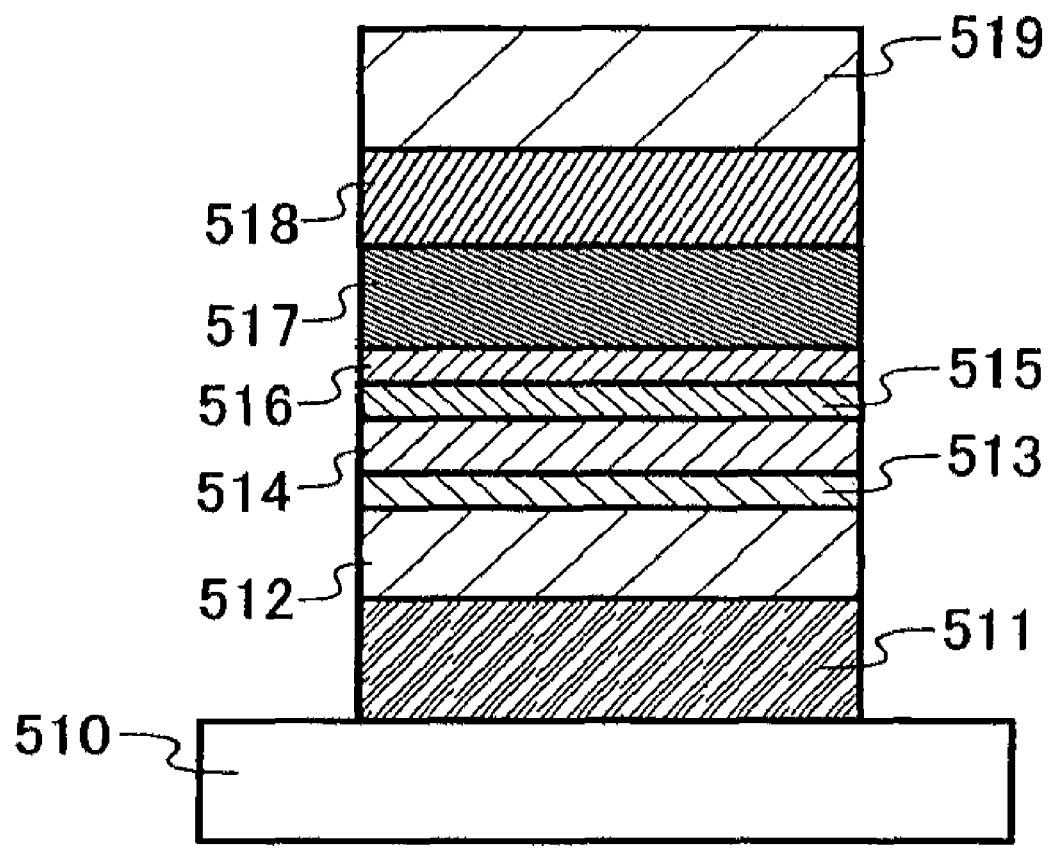
FIG. 10 is a view explaining a light emitting element of Embodiments 1 and 2.

In this embodiment, a light emitting element of the present invention will be specifically described with reference to FIG. 10. Structural formulas of organic compounds used in this embodiment are shown below. It is to be noted that all the light emitting elements manufactured in this embodiment are manufactured over the same substrate.

[Chemical Formulas 4]

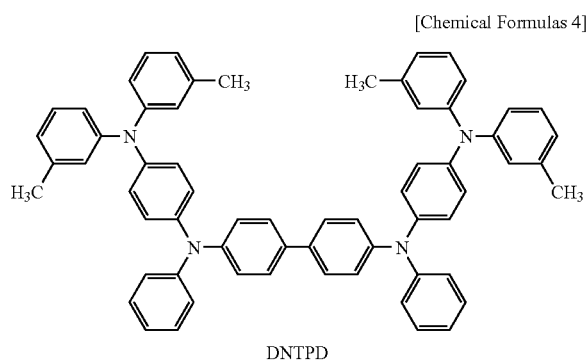
DNTPD

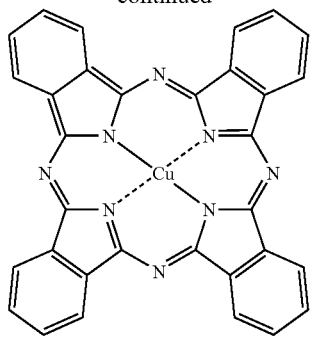
CuPc

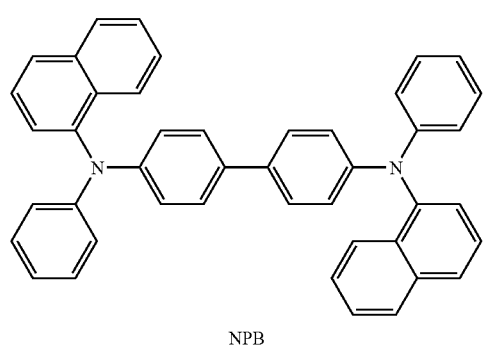
NPB

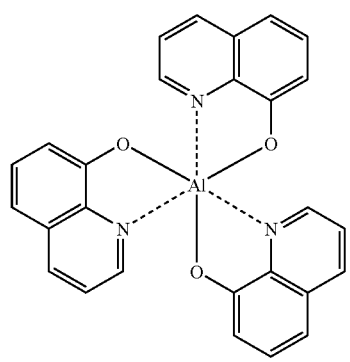
Alq

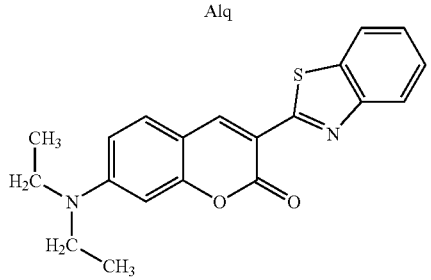
Coumarin 6

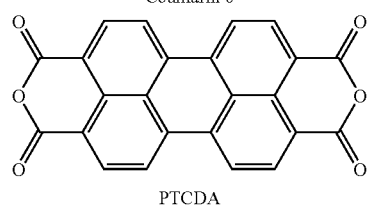
PTCDA (Light Emitting Element 1)

First, a film of indium tin oxide containing silicon oxide was formed over a glass substrate 510 by a sputtering method; whereby a first electrode 511 was formed. The thickness was 110 nm and the electrode area was 2 mm×2 mm.

Next, the substrate on which the first electrode 511 was formed was fixed to a substrate holder that was provided in a vacuum evaporation apparatus, such that the surface on which the first electrode 511 was formed came to the lower side. After the pressure was reduced to be approximately $10^{-4}$ Pa, 4,4'-bis(N-{4-[N'-(3-methylphenyl)-N'-phenylamino]phenyl}-N-phenylamino)biphenyl (abbreviation: DNTPD) and molybdenum oxide (VI) were co-evaporated on the first electrode 511; whereby a layer 512 containing a composite material was formed. The thickness was 50 nm, and the weight ratio of DNTPD to molybdenum oxide (VI) was adjusted so as to be 1:0.5 (=DNTPD: molybdenum oxide). It is to be noted that a co-evaporation method is a method in which evaporations from a plurality of evaporation sources are performed at the same time in one treatment chamber.

Next, 4,4'-bis[N-(1-naphthyl)-N-phenylamino]biphenyl (abbreviation: NPB) was formed to have a thickness of 10 nm by an evaporation method using resistance heating; whereby a hole-transporting layer 513 was formed.

Furthermore, a light emitting layer 514 with a thickness of 40 nm was formed on the hole-transporting layer 513 by co-evaporating tris(8-quinolinolato)aluminum (abbreviation: Alq) and coumarin 6. The weight ratio of Alq to coumarin 6 was adjusted so as to be 1:0.01 (=Alq: coumarin 6).

After that, a film of Alq was formed to have a thickness of 10 nm on the light emitting layer 514, by an evaporation method using resistance heating; whereby an electron-transporting layer 515 was formed.

An electron-injecting layer 516 with a thickness of 10 nm was formed on the electron-transporting layer 515 by co-evaporating Alq and lithium (Li). The weight ratio of Alq to lithium was adjusted so as to be 1:0.01 (=Alq: lithium).

An N-type semiconductor layer 517 with a thickness of 70 nm was formed on the electron-injecting layer 516 by co-evaporating 3,4,9,10-perylenetetracarboxylicdianhydride (abbreviation: PTCDA) and lithium. The weight ratio of PTCDA to lithium was adjusted so as to be 1:0.01 (=PTCDA: lithium).

Furthermore, a P-type semiconductor layer 518 with a thickness of 80 nm was formed by co-evaporating copper phthalocyanine (abbreviation: CuPc) and molybdenum oxide (VI). The weight ratio of CuPc to molybdenum oxide was adjusted so as to be 1:0.5 (=CuPc: molybdenum oxide).

Finally, a film of aluminum was formed to have a thickness of 200 nm by an evaporation method using resistance heating;

whereby a second electrode 519 was formed. In this manner, a light emitting element 1 was manufactured.

(Comparative Light Emitting Element 2)

First, a film of indium tin oxide containing silicon oxide was formed over a glass substrate by a sputtering method; whereby a first electrode was formed. The thickness was 110 nm and the electrode area was 2 mm×2 mm.

Next, the substrate on which the first electrode was formed was fixed to a substrate holder that was provided in a vacuum evaporation apparatus, such that the surface on which the first electrode was formed came to the lower side. After the pressure was reduced to be approximately $10^{-4}$ Pa, 4,4'-bis(N-{4-[N'-(3-methylphenyl)-N'-phenylamino]phenyl}-N-phenylamino)biphenyl (abbreviation: DNTPD) and molybdenum oxide (VI) were co-evaporated on the first electrode; whereby a layer containing a composite material was formed. The thickness was 50 nm, and the weight ratio of DNTPD to molybdenum oxide (VI) was adjusted so as to be 1:0.5 (=DNTPD: molybdenum oxide). It is to be noted that a co-evaporation method is a method in which evaporations from a plurality of evaporation sources are performed at the same time in one treatment chamber.

Next, 4,4'-bis[N-(1-naphthyl)-N-phenylamino]biphenyl (abbreviation: NPB) was formed to have a thickness of 10 nm by an evaporation method using resistance heating; whereby a hole-transporting layer was formed.

Furthermore, a light emitting layer with a thickness of 40 nm was formed on the hole-transporting layer by co-evaporating tris(8-quinolinolato)aluminum (abbreviation: Alq) and coumarin 6. The weight ratio of Alq to coumarin 6 was adjusted so as to be 1:0.01 (=Alq: coumarin 6).

After that, a film of Alq was formed to have a thickness of 10 nm on the light emitting layer, by an evaporation method using resistance heating; whereby an electron-transporting layer was formed.

An electron-injecting layer with a thickness of 20 nm was formed over the electron-transporting layer by co-evaporating Alq and lithium (Li). The weight ratio of Alq to lithium was adjusted so as to be 1:0.01 (=Alq: lithium).

Finally, a film of aluminum was formed to have a thickness of 200 nm by an evaporation method using resistance heating; whereby a second electrode was formed. In this manner, a comparative light emitting element 2 was manufactured.

(Comparative Light Emitting Element 3)

First, a film of indium tin oxide containing silicon oxide was formed over a glass substrate by a sputtering method; whereby a first electrode was formed. The thickness was 110 nm and the electrode area was 2 mm×2 mm.

Next, the substrate on which the first electrode was formed was fixed to a substrate holder that was provided in a vacuum evaporation apparatus, such that the surface on which the first electrode was formed came to the lower side. After the pressure was reduced to be approximately $10^{-4}$ Pa, 4,4'-bis(N-{4-[N'-(3-methylphenyl)-N'-phenylamino]phenyl}-N-phenylamino)biphenyl (abbreviation: DNTPD) and molybdenum oxide (VI) were co-evaporated on the first electrode; whereby a layer containing a composite material was formed. The thickness was 50 nm, and the weight ratio of DNTPD to molybdenum oxide (VI) was adjusted so as to be 1:0.5 (=DNTPD: molybdenum oxide). It is to be noted that a co-evaporation method is a method in which evaporations from a plurality of evaporation sources are performed at the same time in one treatment chamber.

Next, 4,4'-bis[N-(1-naphthyl)-N-phenylamino]biphenyl (abbreviation: NPB) was formed to have a thickness of 10 nm by an evaporation method using resistance heating; whereby a hole-transporting layer was formed.

Furthermore, a light emitting layer with a thickness of 40 nm was formed on the hole-transporting layer by co-evaporating tris(8-quinolinolato)aluminum (abbreviation: Alq) and coumarin 6. The weight ratio of Alq to coumarin 6 was adjusted so as to be 1:0.01 (=Alq: coumarin 6).

After that, a film of Alq was formed to have a thickness of 10 nm on the light emitting layer, by an evaporation method using resistance heating; whereby an electron-transporting layer was formed.

An electron-injecting layer with a thickness of 10 nm was formed on the electron-transporting layer by co-evaporating Alq and lithium (Li). The weight ratio of Alq to lithium was adjusted so as to be 1:0.01 (=Alq: lithium).

A layer with a thickness of 150 nm was formed on the electron-injecting layer by co-evaporating 3,4,9,10-perylene-tetracarboxylicdianhydride (abbreviation: PTCDA) and lithium. The weight ratio of PTCDA to lithium was adjusted so as to be 1:0.01 (=PTCDA: lithium).

Finally, a film of aluminum was formed to have a thickness of 200 nm by an evaporation method using resistance heating; whereby a second electrode was formed. In this manner, a comparative light emitting element 3 was manufactured.

(Comparative Light Emitting Element 4)

First, a film of indium tin oxide containing silicon oxide was formed over a glass substrate by a sputtering method; whereby a first electrode was formed. The thickness was 110 nm and the electrode area was 2 mm×2 mm.

Next, the substrate on which the first electrode was formed was fixed to a substrate holder that was provided in a vacuum evaporation apparatus, such that the surface on which the first electrode was formed came to the lower side. After the pressure was reduced to be approximately $10^{-4}$ Pa, 4,4'-bis(N-{4-[N'-(3-methylphenyl)-N'-phenylamino]phenyl}-N-phenylamino)biphenyl (abbreviation: DNTPD) and molybdenum oxide (VI) were co-evaporated on the first electrode; whereby a layer containing a composite material was formed. The thickness was 50 nm, and the weight ratio of DNTPD to molybdenum oxide (VI) was adjusted so as to be 1:0.5 (=DNTPD: molybdenum oxide). It is to be noted that a co-evaporation method is a method in which evaporations from a plurality of evaporation sources are performed at the same time in one treatment chamber.

Next, 4,4'-bis[N-(1-naphthyl)-N-phenylamino]biphenyl (abbreviation: NPB) was formed to have a thickness of 10 nm by an evaporation method using resistance heating; whereby a hole-transporting layer was formed.

Furthermore, a light emitting layer with a thickness of 40 nm was formed on the hole-transporting layer by co-evaporating tris(8-quinolinolato)aluminum (abbreviation: Alq) and coumarin 6. The weight ratio of Alq to coumarin 6 was adjusted so as to be 1:0.01 (=Alq: coumarin 6).

After that, a film of Alq was formed to have a thickness of 10 nm on the light emitting layer, by an evaporation method using resistance heating; whereby an electron-transporting layer was formed.

An electron-injecting layer with a thickness of 20 nm was formed on the electron-transporting layer by co-evaporating Alq and lithium (Li). The weight ratio of Alq to lithium was adjusted so as to be 1:0.01 (=Alq: lithium).

Furthermore, a layer with a thickness of 140 nm was formed by co-evaporating DNTPD and molybdenum oxide (VI). The weight ratio of DNTPD to molybdenum oxide was adjusted so as to be 1:0.5 (=DNTPD: molybdenum oxide).

Finally, a film of aluminum was formed to have a thickness of 200 nm by an evaporation method using resistance heating; whereby a second electrode was formed. In this manner, a comparative light emitting element 4 was manufactured.

Figure 11:
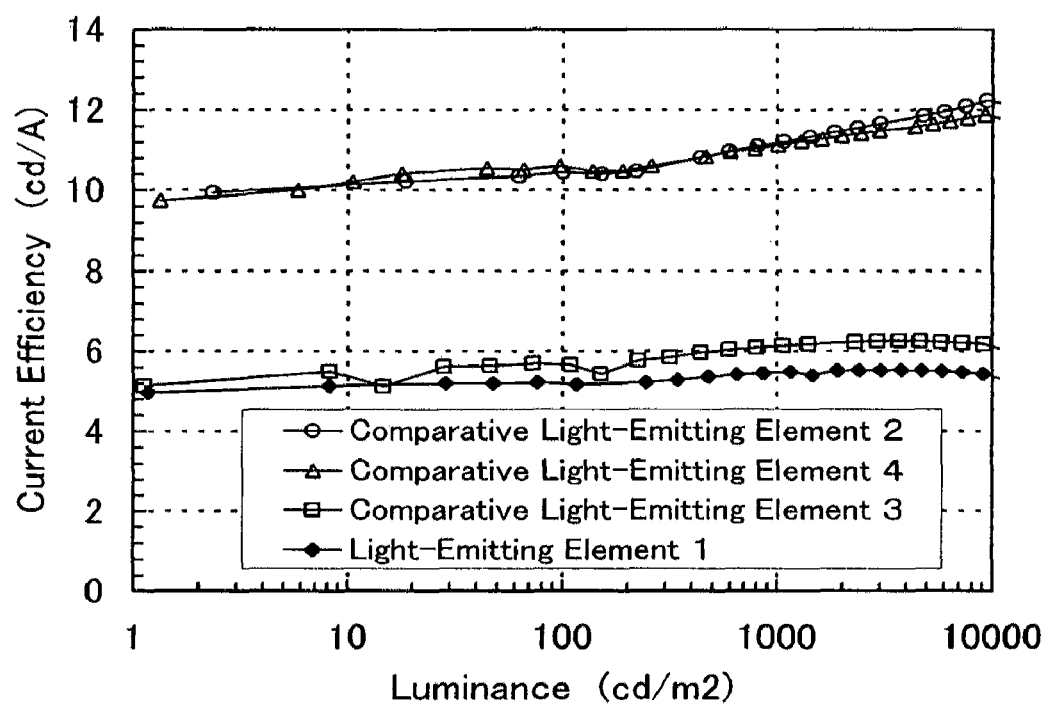
FIG. 11 is a graph showing current efficiency-luminance characteristics of elements manufactured in Embodiment 1.
Figure 12:
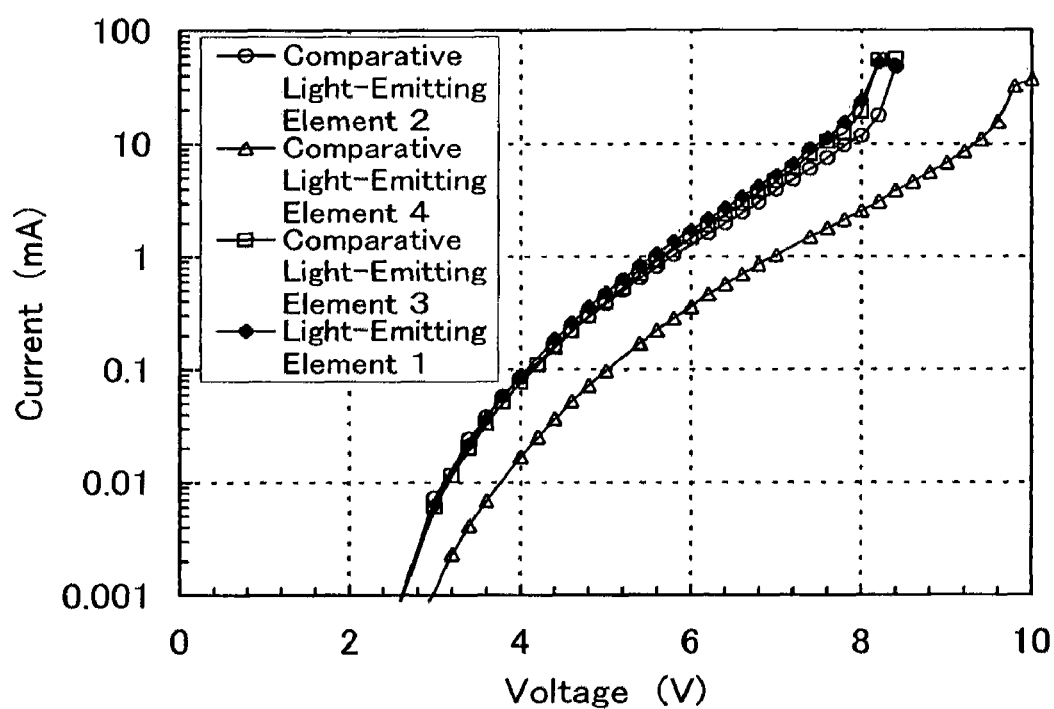
FIG. 12 is a graph showing current-voltage characteristics of elements manufactured in Embodiment 1.
Figure 13:
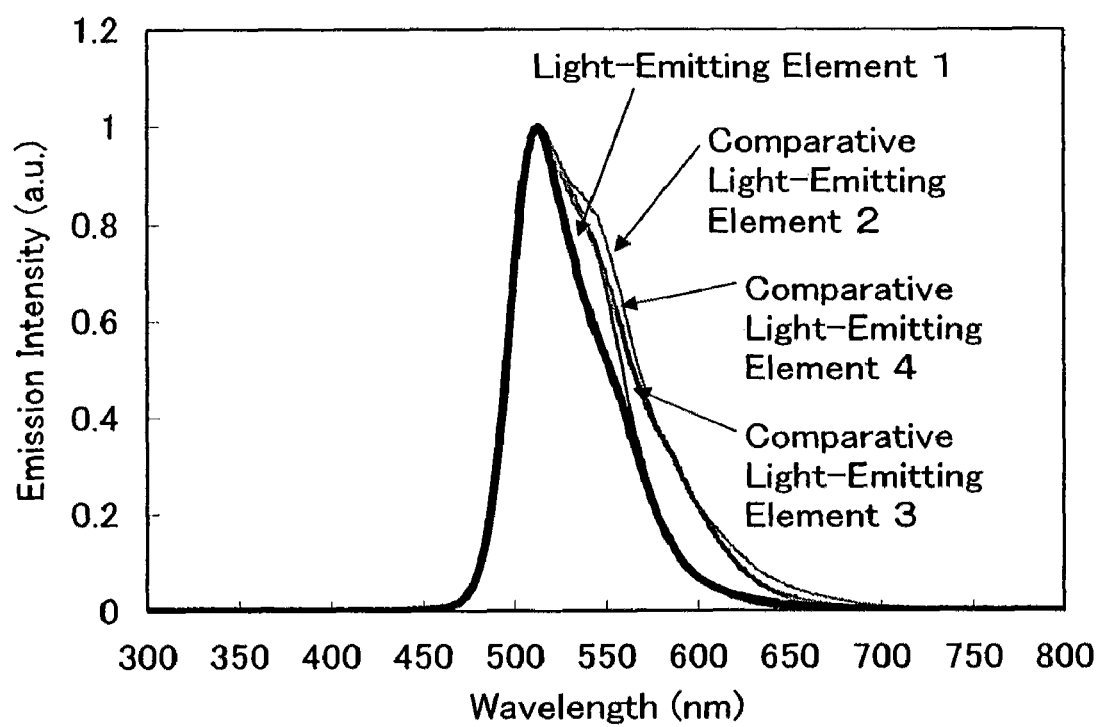
FIG. 13 is a graph showing emission spectrums of elements manufactured in Embodiment 1.

The current efficiency-luminance characteristics of the light emitting element 1, the comparative light emitting element 2, the comparative light emitting element 3, and the comparative light emitting element 4 are shown in FIG. 11. In addition, the current-voltage characteristics thereof are shown in FIG. 12. Furthermore, the emission spectrums thereof are shown in FIG. 13. It can be seen from FIG. 11 that the current efficiency of the light emitting element 1 and the comparative light emitting element 3 is almost half compared to that of the comparative light emitting element 2 and the comparative light emitting element 4. This means that the layer formed on the second electrode side of the light emitting layer absorbs light emitted from the light emitting layer in each of the light emitting element 1 and the comparative light emitting element 3.

Figure 14:
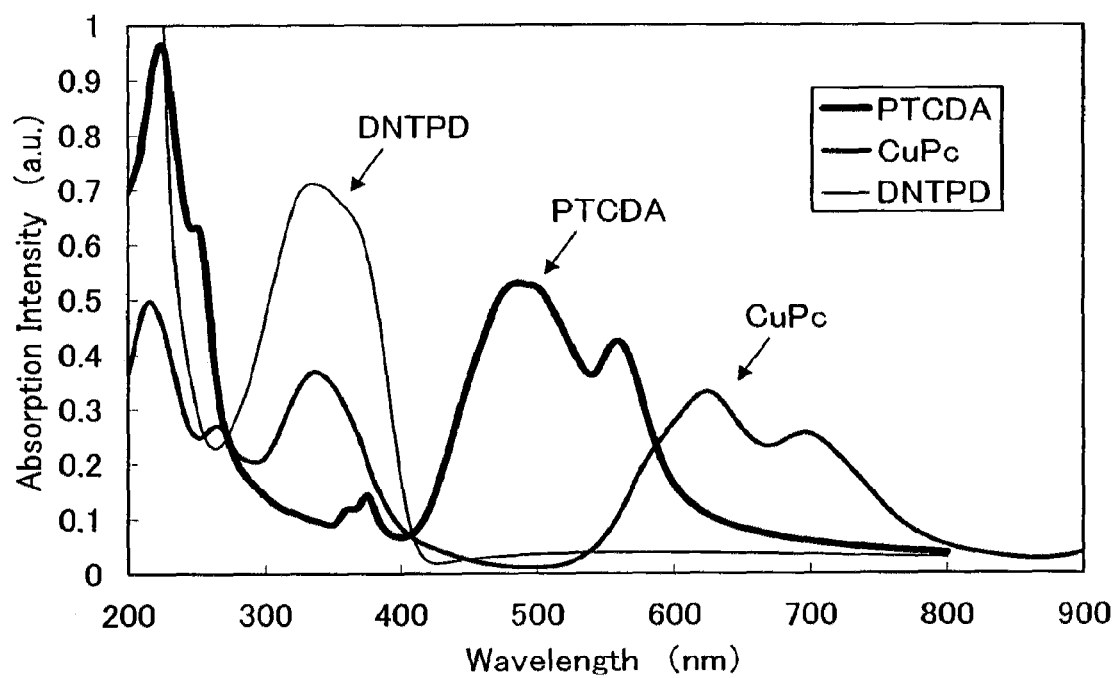
FIG. 14 is a graph showing absorption spectrums of materials used in Embodiment 1.

In FIG. 14, absorption spectrums of PTCDA, CuPc, and DNTPD which were used for the light emitting element 1, the comparative light emitting element 3, or the comparative light emitting element 4 are shown. The absorption spectrums shown in FIG. 14 were obtained by measuring the samples of PTCDA, CuPc, and DNTPD each formed with a thickness of 50 nm over a quartz substrate by an evaporation method. As shown in FIG. 14, PTCDA and CuPc which were used for the light emitting element 1 have absorption peaks in different regions from each other in the visible light region. Specifically, PTCDA has the absorption peaks at 485 nm and 559 nm, and CuPc has the absorption peaks at 624 nm and 695 nm. Furthermore, it can be seen from FIG. 14 that DNTPD does not have an absorption peak in the visible light region.

In addition, the contrast ratios of the light emitting element 1, the comparative light emitting element 2, and the comparative light emitting element 3 were measured under the illumination of 100 (1×). The results were, when the contrast of the comparative light emitting element 2 was to be 1, the contrast ratios of the comparative light emitting element 3 and the light emitting element 1 were 26 and 78, respectively. It was found that the light emitting element to which the present invention was applied had a higher contrast ratio than those of the comparative light emitting element 2 and the comparative light emitting element 3. For this reason, a light emitting element with a high contrast ratio can be obtained by applying the present invention.

The comparative light emitting element 2 is a light emitting element which has a structure generally manufactured. Although the current efficiency thereof is high, the contrast ratio is low. The comparative light emitting element 4 has a structure in which the layer containing DNTPD is provided between the light emitting layer and the second electrode. The layer containing DNTPD transmits a large part of visible light; therefore, it is assumed that the current efficiency is high and the contrast is low, similarly to the comparative light emitting element 2.

On the other hand, the comparative light emitting element 3 uses a layer containing PTCDA, and can partially absorb visible light. In particular, since light emission of coumarin 6 which is used for the light emitting layer of the light emitting element of this embodiment has the spectrum as shown in FIG. 13, light emitted from the light emitting layer (green light) can be absorbed by the layer containing PTCDA. Accordingly, the current efficiency is low as shown in FIG. 11. However, it is impossible to absorb visible light over a wide wavelength range; therefore, part of light from an external source is reflected by the second electrode. Accordingly, the contrast of the comparative light emitting element 3 is lower than that of the light emitting element 1.

On the other hand, the light emitting element 1 can absorb light emitted from the light emitting layer and incident light from an external source over the whole visible light region by the N-type semiconductor layer containing PTCDA and the P-type semiconductor layer containing CuPc. Accordingly, a high contrast can be realized.

Furthermore, it can be seen from FIG. 13 that light emitted from the light emitting layer of the comparative light emitting element interferes with light reflected by the second electrode and the emission spectrum is changed. Specifically, peaks of the emission spectrums of the comparative light emitting element 2, the comparative light emitting element 3, and the comparative light emitting element 4 are broader than that of the light emitting element 1. In other words, the shapes of the emission spectrums are changed by interference effect caused by the second electrode. On the other hand, the light emitting element 1 can suppress light reflected by the second electrode; therefore, the optical design can be performed without considering the interference effect. In addition, since the interference from reflected light is suppressed, the shape of the emission spectrum is not changed and light emission with high color purity can be obtained.

Furthermore, it can be seen from FIG. 12 that the current-voltage characteristics of the light emitting element 1, the comparative light emitting element 2, the comparative light emitting element 3, and the comparative light emitting element 4 are not much different. The thickness of the layers containing a light emitting substance interposed between electrodes in the light emitting element 1 is 140 nm thicker as a whole than that in the comparative light emitting element 2. In spite of this, the current-voltage characteristic of the light emitting element 1 is not much different from that of the comparative light emitting element 2. Accordingly, an increase in driving voltage can be suppressed even when the P-type semiconductor layer and the N-type semiconductor layer are made thick.

Embodiment 2

In this embodiment, a light emitting element of the present invention will be described with reference to FIG. 10. Structural formulas of organic compounds used in this embodiment are shown below. It is to be noted that a light emitting element 5 and a comparative light emitting element 6 are manufactured over the same substrate.

[Chemical Formulas 5]

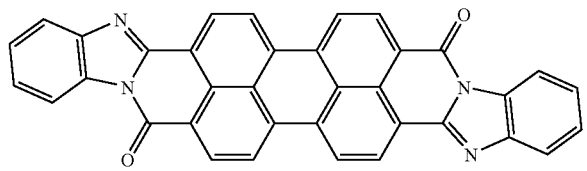

PTCBI

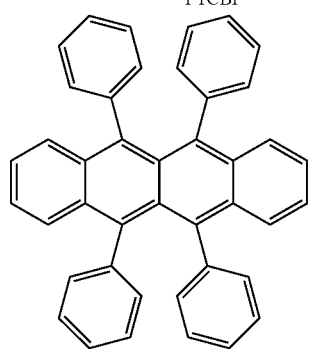

Rubrene (Light Emitting Element 5)

First, a film of indium tin oxide containing silicon oxide was formed over a glass substrate 510 by a sputtering method; whereby a first electrode 511 was formed. The thickness was 110 nm and the electrode area was 2 mm×2 mm.

Next, the substrate on which the first electrode 511 was formed was fixed to a substrate holder that was provided in a vacuum evaporation apparatus, such that the surface on which the first electrode 511 was formed came to the lower side. After the pressure was reduced to be approximately $10^{-4}$ Pa, 4,4'-bis(N-{4-[N'-(3-methylphenyl)-N'-phenylamino]phenyl}-N-phenylamino)biphenyl (abbreviation: DNTPD) and molybdenum oxide (VI) were co-evaporated on the first electrode 511; whereby a layer 512 containing a composite material was formed. The thickness was 50 nm, and the weight ratio of DNTPD to molybdenum oxide (VI) was adjusted so as to be 1:0.5 (=DNTPD: molybdenum oxide). It is to be noted that a co-evaporation method is a method in which evaporations from a plurality of evaporation sources are performed at the same time in one treatment chamber.

Next, 4,4'-bis[N-(1-naphthyl)-N-phenylamino]biphenyl (abbreviation: NPB) was formed to have a thickness of 10 nm by an evaporation method using resistance heating; whereby a hole-transporting layer 513 was formed.

Furthermore, a light emitting layer 514 with a thickness of 40 nm was formed on the hole-transporting layer 513 by co-evaporating tris(8-quinolinolato)aluminum (abbreviation: Alq) and coumarin 6. The weight ratio of Alq to coumarin 6 was adjusted so as to be 1:0.01 (=Alq: coumarin 6).

After that, a film of Alq was formed to have a thickness of 10 nm on the light emitting layer 514, by an evaporation method using resistance heating; whereby an electron-transporting layer 515 was formed.

An electron-injecting layer 516 with a thickness of 10 nm was formed on the electron-transporting layer 515 by co-evaporating Alq and lithium (Li). The weight ratio of Alq to lithium was adjusted so as to be 1:0.01 (=Alq: lithium).

An N-type semiconductor layer 517 with a thickness of 60 nm was formed on the electron-injecting layer 516 by co-evaporating 3,4,9,10-perylenetetracarboxylic-bis-benzimidazole (abbreviation: PTCBI), and lithium. The weight ratio of PTCBI to lithium was adjusted so as to be 1:0.01 (=PTCBI: lithium).

Furthermore, a P-type semiconductor layer 518 with a thickness of 90 nm was formed by co-evaporating rubrene and molybdenum oxide (VI). The weight ratio of rubrene to molybdenum oxide was adjusted so as to be 1:0.5 (=rubrene: molybdenum oxide).

Finally, a film of aluminum was formed to have a thickness of 200 nm by an evaporation method using resistance heating; whereby a second electrode 519 was formed. In this manner, a light emitting element 5 was manufactured.

(Comparative Light Emitting Element 6)

First, a film of indium tin oxide containing silicon oxide was formed over a glass substrate by a sputtering method; whereby a first electrode was formed. The thickness was 110 nm and the electrode area was 2 mm×2 mm.

Next, the substrate on which the first electrode was formed was fixed to a substrate holder that was provided in a vacuum evaporation apparatus, such that the surface on which the first electrode was formed came to the lower side. After the pressure was reduced to be approximately $10^{-4}$ Pa, 4,4'-bis(N-{4-[N'-(3-methylphenyl)-N'-phenylamino]phenyl}-N-phenylamino)biphenyl (abbreviation: DNTPD) and molybdenum oxide (VI) were co-evaporated on the first electrode; whereby a layer containing a composite material was formed. The thickness was 50 nm, and the weight ratio of DNTPD to molybdenum oxide (VI) was adjusted so as to be 1:0.5 (=DNTPD: molybdenum oxide). It is to be noted that a co-evaporation method is a method in which evaporations from a plurality of evaporation sources are performed at the same time in one treatment chamber.

Next, 4,4'-bis[N-(1-naphthyl)-N-phenylamino]biphenyl (abbreviation: NPB) was formed to have a thickness of 10 nm by an evaporation method using resistance heating; whereby a hole-transporting layer was formed.

Furthermore, a light emitting layer with a thickness of 40 nm was formed on the hole-transporting layer by co-evaporating tris(8-quinolinolato)aluminum (abbreviation: Alq) and coumarin 6. The weight ratio of Alq to coumarin 6 was adjusted so as to be 1:0.01 (=Alq: coumarin 6).

After that, a film of Alq was formed to have a thickness of 10 nm on the light emitting layer, by an evaporation method using resistance heating; whereby an electron-transporting layer was formed.

An electron-injecting layer with a thickness of 20 nm was formed on the electron-transporting layer by co-evaporating Alq and lithium (Li). The weight ratio of Alq to lithium was adjusted so as to be 1:0.01 (=Alq: lithium).

Finally, a film of aluminum was formed to have a thickness of 200 nm by an evaporation method using resistance heating; whereby a second electrode was formed. In this manner, a comparative light emitting element 6 was manufactured.

Figure 15:
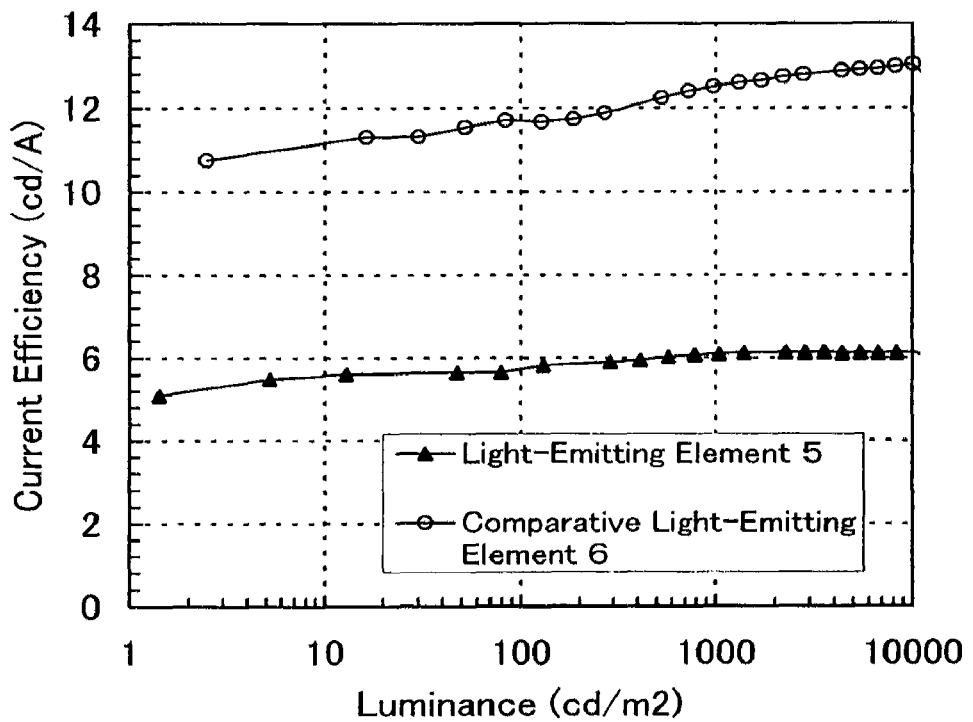
FIG. 15 is a graph showing current efficiency-luminance characteristics of elements manufactured in Embodiment 2.
Figure 16:
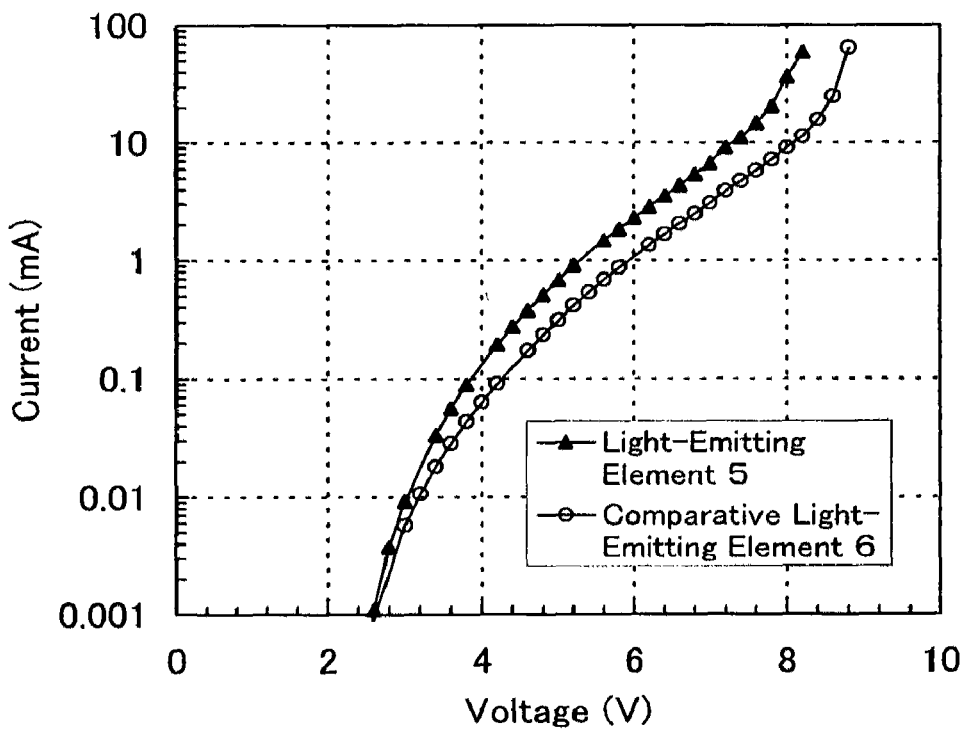
FIG. 16 is a graph showing current-voltage characteristics of elements manufactured in Embodiment 2.
Figure 17:
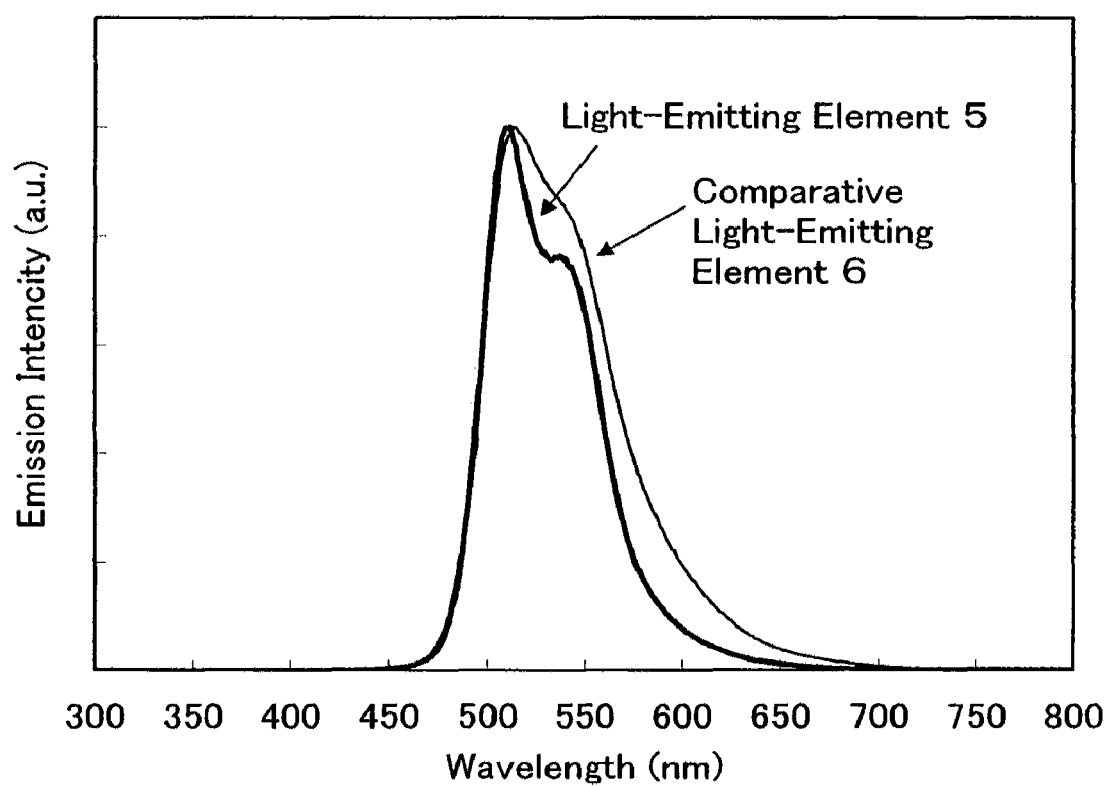
FIG. 17 is a graph showing emission spectrums of elements manufactured in Embodiment 2.

The current efficiency-luminance characteristics of the light emitting element 5 and the comparative light emitting element 6 are shown in FIG. 15. In addition, the current-voltage characteristics thereof are shown in FIG. 16. Furthermore, the emission spectrums thereof are shown in FIG. 17. It can be seen from FIG. 15 that the current efficiency of the light emitting element 5 is almost half compared to that of the comparative light emitting element 6. This means that the layer formed on the second electrode side of the light emitting layer absorbs light emitted from the light emitting layer in the light emitting element 5.

Figure 18:
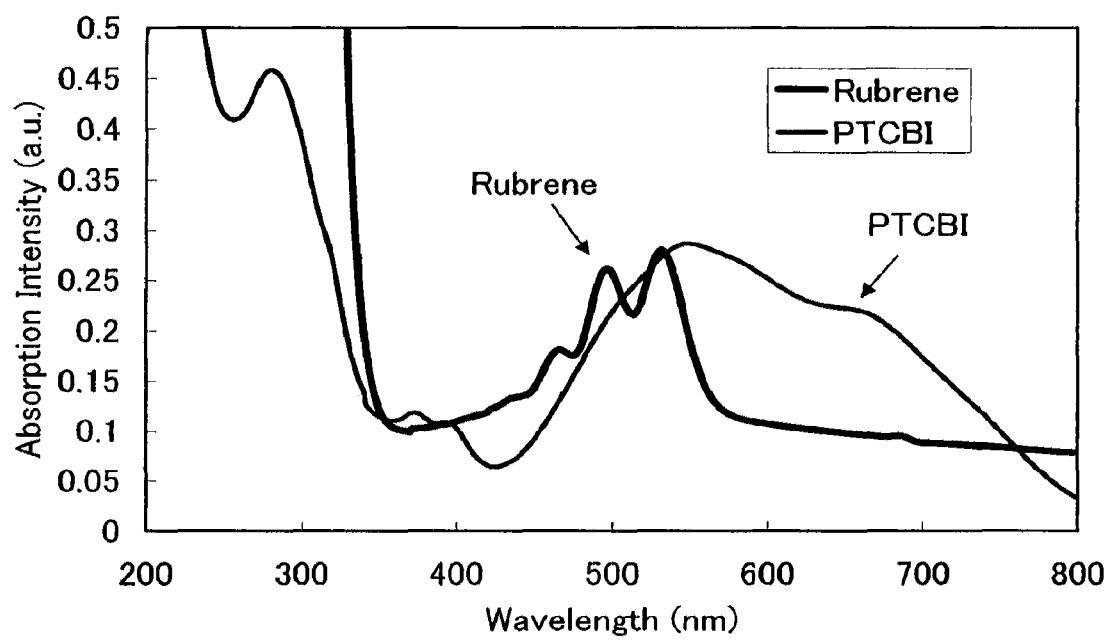
FIG. 18 is a graph showing absorption spectrums of materials used in Embodiment 2.

In FIG. 18, absorption spectrums of PTCBI and rubrene which were used for the light emitting element 5 are shown. The absorption spectrums shown in FIG. 18 were obtained by measuring the samples of PTCBI and rubrene each formed over a quartz substrate by an evaporation method. As shown in FIG. 18, PTCBI and rubrene which were used for the light emitting element 5 have the absorption peaks in different regions from each other in the visible light region. Specifically, PTCBI has the absorption peak at 548 nm, and rubrene has the absorption peaks at 496 nm and 531 nm.

In addition, the contrast ratios of the light emitting element 5 and the comparative light emitting element 6 were measured under the illumination of 100 (1×). The results were, when the contrast of the comparative light emitting element 6 was set to be 1, the contrast ratio of the light emitting element 5 was 17. It was found that the light emitting element to which the present invention was applied had a higher contrast ratio than that of the comparative light emitting element 6. For this reason, a light emitting element with a high contrast ratio can be obtained by applying the present invention.

The comparative light emitting element 6 is a light emitting element which has a structure generally manufactured, in which the current efficiency is high but the contrast is low.

On the other hand, the light emitting element 5 can absorb light emitted from the light emitting layer and incident light from an external source over the whole visible light region by the N-type semiconductor layer containing PTCBI and the P-type semiconductor layer containing rubrene. Accordingly, a high contrast can be realized.

Furthermore, it can be seen from FIG. 17 that light emitted from the light emitting layer of the comparative light emitting element interferes with light reflected by the second electrode and the emission spectrum is changed. Specifically, a peak of the emission spectrum of the comparative light emitting element 6 is broader than that of the light emitting element 5. In other words, the shape of the emission spectrum is changed by interference effect caused by the second electrode. On the other hand, the light emitting element 5 can suppress light reflected by the second electrode; therefore, the optical design can be performed without considering the interference effect. In addition, since the interference from reflected light is suppressed, the shape of the emission spectrum is not changed and light emission with high color purity can be obtained.

Furthermore, it can be seen from FIG. 16 that the current-voltage characteristics of the light emitting element 5 and the comparative light emitting element 6 are not much different. The thickness of the layers containing a light emitting substance interposed between electrodes in the light emitting element 5 is 140 nm thicker as a whole than that in the comparative light emitting element 6. In spite of this, the current-voltage characteristic of the light emitting element 5 is not much different from that of the comparative light emitting element 6. Accordingly, an increase in driving voltage can be suppressed even when the P-type semiconductor layer and the N-type semiconductor layer are made thick.

This application is based on Japanese Patent Application serial No. 2006-061969 filed in Japan Patent Office on Mar. 8, 2006, the contents of which are hereby incorporated by reference.

What is claimed is:

1. A light emitting element comprising:
   a first electrode;
   a second electrode; and
   a first layer containing a light emitting substance interposed between the first electrode and the second electrode,
   wherein the first layer comprises:
     a light emitting layer;
     a second layer containing a first organic compound;
     a third layer containing a second organic compound; and
     a fourth layer including a metal oxide,
   wherein the first electrode has a light-transmitting property,
   wherein a thickness of the fourth layer is 50 nm to 150 nm,
   wherein a total thickness of the second layer and the third layer is 150 nm or more,
   wherein the second layer and the third layer are interposed between the second electrode and the light emitting layer, and
   wherein color of the first organic compound and color of the second organic compound are complementary colors to each other so that at least a portion of light emitted from the light emitting layer can be absorbed by the second layer and the third layer.

2. The light emitting element according to claim 1 further comprising:
   a fifth layer between the second layer and the third layer,
   wherein the fifth layer contains a conductive material.

3. The light emitting element according to claim 2, wherein the conductive material is one selected from the group consisting of indium tin oxide, indium tin oxide containing silicon or silicon oxide, indium zinc oxide, and indium tin oxide containing tungsten oxide and zinc oxide.

4. The light emitting element according to claim 1 further comprising:
   a fifth layer between the second layer and the third layer,
   wherein the fifth layer contains a semiconductor material.

5. The light emitting element according to claim 4, wherein the semiconductor material is one selected from the group consisting of titanium oxide, vanadium oxide, niobium oxide, molybdenum oxide, tungsten oxide, rhenium oxide, ruthenium oxide, cobalt oxide, nickel oxide, zinc oxide, copper oxide, tin oxide, zinc sulfide, gallium nitride, and gallium aluminum nitride.

6. A light emitting device comprising the light emitting element according to claim 1 and a controller for controlling light emission of the light emitting element.

7. An electronic device comprising a display portion wherein the display portion includes the light emitting element according to claim 1 and a controller for controlling light emission of the light emitting element.

8. The light emitting element according to claim 1, wherein the first organic compound has an absorption peak in a wavelength region of greater than or equal to 380 nm and less than 540 nm, and the second organic compound has an absorption peak in a wavelength region of greater than or equal to 540 nm and less than or equal to 760 nm.

9. The light emitting element according to claim 1,
   wherein the first organic compound is any of 3,4,9,10-perylenetetracarboxylic acid derivatives, 1,4,5,8,-naphthalenetetracarboxylic acid derivatives, naphthacene derivatives, or nickel complexes, and
   wherein the second organic compound is any of phthalocyanine derivatives, pentacene derivatives, 3,4,9,10-perylenetetracarboxylic-bis-benzimidazole derivatives, or violanthrone derivatives.

10. The light emitting element according to claim 1, wherein one of the second layer and the third layer is in contact with the second electrode.

11. A light emitting element comprising:
    a first electrode;
    a second electrode; and
    a first layer containing a light emitting substance interposed between the first electrode and the second electrode,
    wherein the first layer comprises:
      a light emitting layer;
      a first semiconductor layer;
      a second semiconductor layer; and
      a second layer including a metal oxide,
    wherein the first electrode, the light emitting layer, the first semiconductor layer, the second semiconductor layer, and the second electrode are formed in this order,
    wherein the first electrode has a light-transmitting property,
    wherein a thickness of the second layer is 50 nm to 150 nm,
    wherein a total thickness of the first semiconductor layer and the second semiconductor layer is 150 nm or more,
    wherein color of the first semiconductor layer and color of the second semiconductor layer are complementary colors to each other so that at least a portion of light emitted from the light emitting layer can be absorbed by the first semiconductor layer and the second semiconductor layer, and
    wherein one of the first semiconductor layer and the second semiconductor layer is an N-type semiconductor layer and the other one of the first semiconductor layer and the second semiconductor layer is a P-type semiconductor layer.

12. The light emitting element according to claim 11 further comprising:
    a third layer between the first semiconductor layer and the second semiconductor layer, and
    wherein the third layer contains a conductive material.

13. The light emitting element according to claim 12 wherein the conductive material is one selected from the group consisting of indium tin oxide, indium tin oxide containing silicon or silicon oxide, indium zinc oxide, and indium tin oxide containing tungsten oxide and zinc oxide.

14. The light emitting element according to claim 11 further comprising:
a third layer between the first semiconductor layer and the second semiconductor layer,
wherein the third layer contains a semiconductor material.

15. The light emitting element according to claim 14, wherein the semiconductor material is one selected from the group consisting of titanium oxide, vanadium oxide, niobium oxide, molybdenum oxide, tungsten oxide, rhenium oxide, ruthenium oxide, cobalt oxide, nickel oxide, zinc oxide, copper oxide, tin oxide, zinc sulfide, gallium nitride, and gallium aluminum nitride.

16. The light emitting element according to claim 11, wherein the P-type semiconductor layer further contains an acceptor material.

17. The light emitting element according to claim 16, wherein the acceptor material is 7,7,8,8-tetracyano-2,3,5,6-tetrafluoroquinodimethane, or chloranil.

18. The light emitting element according to claim 16, wherein the acceptor material is a transition metal oxide.

19. The light emitting element according to claim 16, wherein the acceptor material is one selected from the group consisting of vanadium oxide, niobium oxide, tantalum oxide, chromium oxide, molybdenum oxide, tungsten oxide, manganese oxide, and rhenium oxide.

20. The light emitting element according to claim 11, wherein the N-type semiconductor layer further contains a donor material.

21. The light emitting element according to claim 20, wherein the donor material is one selected from the group consisting of an alkali metal, an alkaline earth metal, a rare earth metal, and a metal belonging to Group 13 of the periodic table.

22. The light emitting element according to claim 20, wherein the donor material is one selected from the group consisting of lithium, cesium, magnesium, calcium, ytterbium, and indium.

23. A light emitting device comprising the light emitting element according to claim 11 and a controller for controlling light emission of the light emitting element.

24. An electronic device comprising a display portion wherein the display portion includes the light emitting element according to claim 11 and a controller for controlling light emission of the light emitting element.

25. The light emitting element according to claim 11, wherein the N-type semiconductor layer has an absorption peak in a wavelength region of greater than or equal to 380 nm and less than 540 nm, and the P-type semiconductor layer has an absorption peak in a wavelength region of greater than or equal to 540 nm and less than or equal to 760 nm.

26. The light emitting element according to claim 11,
wherein the N-type semiconductor layer contains any of 3,4,9,10-perylenetetracarboxylicdianhydride, 3,4,9,10-perylenetetracarboxylicdiimide, N,N'-dimethyl-3,4,9,10-perylenetetracarboxylicdiimide, 1,4,5,8-naphthalenetetracarboxylicdianhydride, or 1,4,5,8-naphthalenetetracarboxylicdiimide, and
wherein the P-type semiconductor layer contains any of phthalocyanine, copper phthalocyanine, zinc phthalocyanine, vanadyl phthalocyanine, titanyl phthalocyanine, nickel phthalocyanine, pentacene, or 6,13-diphenylpentacene.

27. The light emitting element according to claim 11,
wherein the N-type semiconductor layer has an absorption peak in a wavelength region of greater than or equal to 540 nm and less than or equal to 760 nm, and
wherein the P-type semiconductor layer has an absorption peak in a wavelength region of greater than or equal to 380 nm and less than 540 nm.

28. The light emitting element according to claim 11,
wherein the N-type semiconductor layer contains any of (1,2,3,4,8,9,10,11,15,16,17,18,22,23,24,25-hexadecafluorophthalocyaninato)copper, (1,2,3,4,8,9,10,11,15,16,17,18,22,23,24,25-hexadecafluorophthalocyaninato)zinc, perfluoropentacene, or 3,4,9,10-perylenetetracarboxylic-bis-benzimidazole, and
wherein the P-type semiconductor layer contains any of naphthacene, 5,12-diphenylnaphthacene, or rubrene.

29. The light emitting element according to claim 11, wherein the second semiconductor layer is in contact with the second electrode.

* * * * *